(12) United States Patent
Kim et al.

(10) Patent No.: US 12,262,585 B2
(45) Date of Patent: Mar. 25, 2025

(54) ELECTRONIC DEVICE INCLUDING ORGANIC-POLYMER ENCAPSULATION LAYER

(71) Applicant: Samsung Display Co., Ltd., Yongin-Si (KR)

(72) Inventors: Kihyun Kim, Hwaseong-si (KR); Ji Hwang Lee, Hwaseong-si (KR); Manjae Park, Asan-si (KR); Younggil Park, Asan-si (KR); Goeun Yun, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 470 days.

(21) Appl. No.: 17/680,555

(22) Filed: Feb. 25, 2022

(65) Prior Publication Data
US 2022/0376211 A1 Nov. 24, 2022

(30) Foreign Application Priority Data

May 24, 2021 (KR) .......................... 10-2021-0066307

(51) Int. Cl.
*H10K 50/86* (2023.01)
*H10K 50/84* (2023.01)
(Continued)

(52) U.S. Cl.
CPC ........... *H10K 50/86* (2023.02); *H10K 50/844* (2023.02); *H10K 59/12* (2023.02); *H10K 59/40* (2023.02);
(Continued)

(58) Field of Classification Search
CPC ...... H10K 50/86; H10K 50/844; H10K 50/15; H10K 50/16; H10K 50/17; H10K 50/171;
(Continued)

(56) References Cited

U.S. PATENT DOCUMENTS

| 7,902,549 B2 | 3/2011 | Yang et al. |
| 2018/0061898 A1* | 3/2018 | Oh ........................ H10K 59/873 |

(Continued)

FOREIGN PATENT DOCUMENTS

| KR | 10-0915231 | 9/2009 | |
| KR | 20190098298 A * | 8/2019 | ........... H10K 50/844 |

(Continued)

OTHER PUBLICATIONS

White et al., "Polymer Free Volume and Its Connection to the Glass Transition", Macromolecules, Jun. 2016, vol. 49 Issue 11, p. 3987-4007, 21pp.

(Continued)

*Primary Examiner* — Ida M Soward
(74) *Attorney, Agent, or Firm* — F. CHAU & ASSOCIATES, LLC

(57) ABSTRACT

An electronic device includes a light emitting element. An encapsulation layer is disposed on the light emitting element. The encapsulation layer includes a polymer having a molecular anisotropy greater than or equal to about 1.4. A sensor layer is disposed on the encapsulation layer. The molecular anisotropy is a ratio of a first absorbance of an infrared spectrum in an infrared spectroscopy when first polarized light that is polarized in a first direction perpendicular to a second direction is incident to the polymer to a second absorbance of an infrared spectrum in an infrared spectroscopy when second polarized light that is polarized in the second direction is incident to the polymer.

22 Claims, 12 Drawing Sheets

(51) Int. Cl.
*H10K 50/844* (2023.01)
*H10K 59/12* (2023.01)
*H10K 59/40* (2023.01)
*H10K 85/10* (2023.01)
*H10K 50/15* (2023.01)
*H10K 50/16* (2023.01)
*H10K 50/17* (2023.01)
*H10K 50/80* (2023.01)
*H10K 50/842* (2023.01)
*H10K 59/122* (2023.01)
*H10K 59/80* (2023.01)

(52) U.S. Cl.
CPC .......... *H10K 85/141* (2023.02); *H10K 50/15* (2023.02); *H10K 50/16* (2023.02); *H10K 50/17* (2023.02); *H10K 50/171* (2023.02); *H10K 50/8426* (2023.02); *H10K 50/8445* (2023.02); *H10K 50/868* (2023.02); *H10K 59/122* (2023.02); *H10K 59/873* (2023.02)

(58) Field of Classification Search
CPC .......... H10K 50/8426; H10K 50/8445; H10K 50/868; H10K 59/12; H10K 59/122; H10K 59/873; H10K 85/141; G02F 1/15165; G02F 1/1523; G02F 1/1533; G06F 3/0412; C08F 2/48; C08F 220/14; C08F 222/10; C08L 35/02
See application file for complete search history.

(56) References Cited

U.S. PATENT DOCUMENTS

| | | | |
|---|---|---|---|
| 2018/0095566 A1* | 4/2018 | Lee | G06F 3/0412 |
| 2018/0095567 A1* | 4/2018 | Lee | G06F 3/0412 |
| 2018/0329552 A1* | 11/2018 | Song | G06F 3/044 |
| 2020/0052058 A1* | 2/2020 | Lee | H10K 59/873 |
| 2020/0212114 A1* | 7/2020 | Song | G06F 3/0412 |
| 2021/0026478 A1* | 1/2021 | Lee | G09G 3/3233 |
| 2021/0028395 A1* | 1/2021 | Kim | H10K 59/8731 |
| 2021/0074772 A1* | 3/2021 | Kim | H10K 50/844 |
| 2021/0098741 A1* | 4/2021 | Park | H10K 59/873 |
| 2021/0109610 A1* | 4/2021 | Jung | H10K 50/865 |
| 2021/0132720 A1* | 5/2021 | Lee | H10K 50/865 |
| 2021/0181916 A1* | 6/2021 | Kwon | H10K 71/70 |
| 2022/0050317 A1* | 2/2022 | Ku | G02F 1/13338 |
| 2022/0376211 A1* | 11/2022 | Kim | H10K 50/844 |

FOREIGN PATENT DOCUMENTS

| | | |
|---|---|---|
| KR | 10-2020-0038631 | 4/2020 |
| KR | 10-2020-0078559 | 7/2020 |
| KR | 10-2020-0124804 | 11/2020 |

OTHER PUBLICATIONS

Mathesana et. al., "Non-affine deformation of free volume during strain dependent diffusion in polymer thin films", Polymer 155 (2018) 177-186.

* cited by examiner

ELECTRONIC DEVICE INCLUDING ORGANIC-POLYMER ENCAPSULATION LAYER

CROSS-REFERENCE TO RELATED APPLICATIONS

This application claims priority under 35 U.S.C. § 119 to Korean Patent Application No. 10-2021-0066307, filed on May 24, 2021, in the Korean Intellectual Property Office, the disclosure of which is incorporated by reference in its entirety herein.

1. TECHNICAL FIELD

Embodiments of the present disclosure relate to an electronic device, and more particularly, to an electronic device including a sensor layer disposed on a display layer.

2. DISCUSSION OF RELATED ART

An electronic device includes an active area that is activated according to an electrical signal. The electronic device may detect an input applied from an outside position, such as on, or in proximity, to the active area, and simultaneously display various images to provide information to a user.

The electronic device may include a light emitting element having an organic electro-luminescent material or a quantum dot light emitting material. The light emitting element is vulnerable to contaminants from the external environment, such as oxygen and moisture. Therefore, various means for sealing the light emitting element may be provided. In one example, an encapsulation layer may be disposed on the light emitting element to block a path of the air and moisture to prevent the air and moisture from penetrating into the light emitting element. However, when a sensor layer such as a touch panel is provided on the encapsulation layer, a touch sensitivity may be lowered or a malfunction may occur due to the presence of the encapsulation layer.

SUMMARY

Embodiments of the present disclosure provide an electronic device including an encapsulation layer having a reduced dielectric constant.

Further, embodiments of the present disclosure provide an electronic device including an encapsulation layer having an organic layer of a low dielectric constant, and thus having increased operational quality of a sensor layer disposed on the encapsulation layer.

According to an embodiment of the present disclosure, an electronic device includes a light emitting element. An encapsulation layer is disposed on the light emitting element. The encapsulation layer includes a polymer having a molecular anisotropy greater than or equal to about 1.4. A sensor layer is disposed on the encapsulation layer. The molecular anisotropy is a ratio of a first absorbance of an infrared spectrum in an infrared spectroscopy when first polarized light that is polarized in a first direction perpendicular to a second direction is incident to the polymer to a second absorbance of an infrared spectrum in an infrared spectroscopy when second polarized light that is polarized in the second direction is incident to the polymer.

In an embodiment, the molecular anisotropy of the polymer may be in a range of about 1.4 to about 1.9.

In an embodiment, the polymer may be produced using a composition containing a dimethacrylate compound, a (meth)acrylate compound, and a photo-initiator.

In an embodiment, the composition may contain the dimethacrylate compound in a range of about 50 wt % to about 90 wt %, the (meth)acrylate compound in a range of about 0 wt % to about 40 wt %, and the photo-initiator in a range of about 1 wt % to about 10 wt %, based on a total weight of the composition of 100 wt %.

In an embodiment, the composition further may contain an acrylate-based cross-linker.

In an embodiment, the polymer may include a (meth)acrylate-based polymer.

In an embodiment, a glass transition temperature of the polymer may be in a range of about −28° C. to about 1.4° C.

In an embodiment, the encapsulation layer may include at least one organic layer and at least one inorganic layer. The at least one organic layer may include the polymer.

In an embodiment, the at least one organic layer and the at least one inorganic layer may be alternately stacked with each other.

In an embodiment, a dielectric constant of the at least one organic layer may be in a range of about 2.6 to about 3.0.

In an embodiment, a content of oxygen atoms in the at least one organic layer is less than or equal to about 5 at %.

In an embodiment, the at least one organic layer may have a ratio of an absorbance of an infrared spectrum in an infrared spectroscopy by a C—H bond to an absorbance of an infrared spectrum in an infrared spectroscopy by a C=O bond in a range of about 0.25 to about 0.40 inclusive.

In an embodiment, the sensor layer may be disposed directly on the encapsulation layer.

According to an embodiment of the present disclosure, an electronic device includes a light emitting element. An encapsulation layer is disposed on the light emitting element. The encapsulation layer may include at least one organic layer having a dielectric constant in a range of about 2.6 to about 3.0. A sensor layer is disposed on the encapsulation layer. The at least one organic layer includes a (meth)acrylate-based polymer produced using a composition containing a dimethacrylate compound, a (meth)acrylate compound, and a photo-initiator.

In an embodiment, a molecular anisotropy of the polymer may be in a range of about 1.4 to about 1.9. The molecular anisotropy may be a ratio of a first absorbance of an infrared spectrum in an infrared spectroscopy when first polarized light that is polarized in a first direction perpendicular to a second direction is incident to the polymer to a second absorbance of an infrared spectrum in an infrared spectroscopy when second polarized light that is polarized in the second direction is incident to the polymer.

In an embodiment, the organic layer may have a ratio of an absorbance of an infrared spectrum in an infrared spectroscopy by a C—H bond to an absorbance of an infrared spectrum in an infrared spectroscopy by a C=O bond in a range of about 0.25 to about 0.40.

In an embodiment, the encapsulation layer may be disposed directly on the light emitting element and the sensor layer may be disposed directly on the encapsulation layer.

In an embodiment, the sensor layer may include a first conductive layer disposed on the encapsulation layer, a second conductive layer disposed on the first conductive layer, an insulating layer disposed between the first conductive layer and the second conductive layer, and a sensor base layer disposed below the first conductive layer. The sensor base layer may be disposed directly on the encapsulation layer.

In an embodiment, the composition includes the dimethacrylate compound in a range of about 50 wt % to about 90 wt %, the (meth)acrylate compound in a range of about 0 wt % to about 40 wt %, and the photo-initiator in a range of about 1 wt % to about 10 wt %, based on a total weight of the composition of 100 wt %.

In an embodiment, a content of oxygen atoms in the organic layer is less than or equal to about 5 at %.

According to an embodiment of the present disclosure, an electronic device includes a light emitting element. An encapsulation layer is disposed on the light emitting element. The encapsulation layer including n inorganic layers and n−1 organic layers alternately stacked with each other in which n is an integer greater than or equal to 2. A sensor layer is disposed on the encapsulation layer. At least one of the n−1 organic layers has a dielectric constant that is less than or equal to about 3.0.

In an embodiment, the at least one of the n−1 organic layers includes a (meth)acrylate-based polymer composed of a composition including a dimethacrylate compound in a range of about 50 wt % to about 90 wt %, a (meth)acrylate compound in a range of about 0 wt % to about 40 wt %, and a photo-initiator in a range of about 1 wt % to about 10 wt %, based on a total weight of the composition of 100 wt %.

BRIEF DESCRIPTION OF THE DRAWINGS

The above and other objects and features of the present disclosure will become apparent by describing in detail embodiments thereof with reference to the accompanying drawings.

DETAILED DESCRIPTION OF EMBODIMENTS

Figure 1:
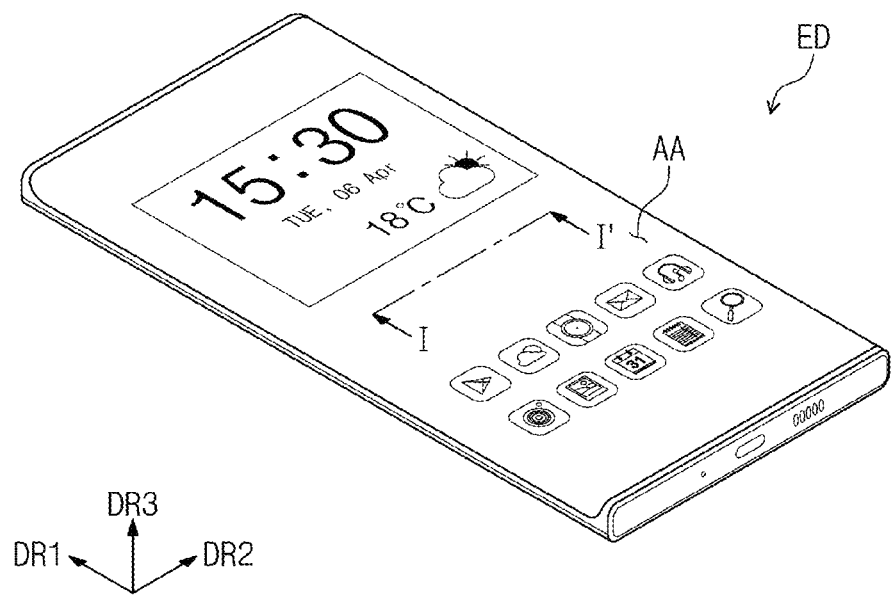
FIG. 1 is a perspective view of an electronic device according to an embodiment of the present disclosure.

Various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. When an element or layer is referred to as being "directly connected to", or "directly coupled to" another element or layer, no intervening elements or layers may be present. In addition, it will also be understood that when an element or layer is referred to as being "between" two elements or layers, it may be the only element or layer between the two elements or layers, or one or more intervening elements or layers may also be present. When an element or layer is referred to as being "directly between" two elements or layers, no intervening elements or layers may be present.

In addition, it will also be understood that when a first element or layer is referred to as being present or disposed "on" a second element or layer, the first element may be disposed directly on the second element or may be disposed indirectly on the second element with a third element or layer being disposed between the first and second elements or layers. When a first element or layer is referred to as being present or disposed "directly on" a second element or layer, no intervening elements or layers are disposed between the first and second elements or layers.

For simplicity and clarity of illustration, elements in the drawings are not necessarily drawn to scale. The same reference numbers in different drawings denote the same or similar elements, and as such perform similar functionality. A shape, a size, a ratio, an angle, a number, etc. disclosed in the drawings for describing an embodiment of the present disclosure are for illustrative purposes, and embodiments of the present disclosure is not limited thereto. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

As used herein, the singular forms "a" and "an" are intended to include the plural forms as well, unless the context clearly indicates otherwise.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an electronic device according to an embodiment of the present disclosure will be described with reference to the drawings.

Figure 2:
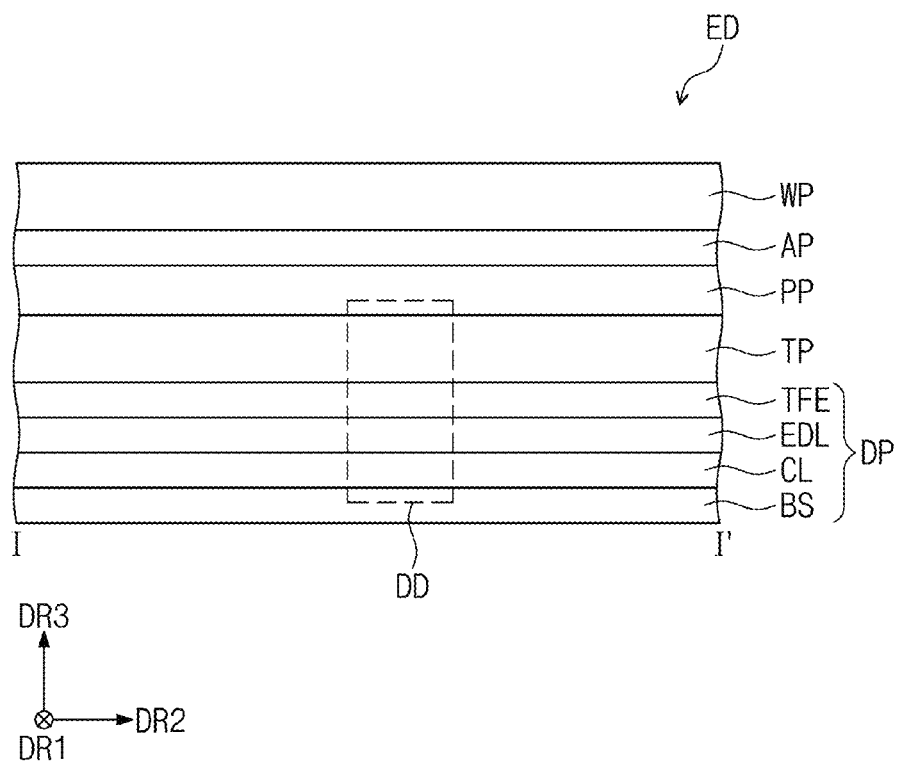
FIG. 2 is a cross-sectional view of an electronic device taken along line I-I' of FIG. 1 according to an embodiment of the present disclosure.
Figure 3:
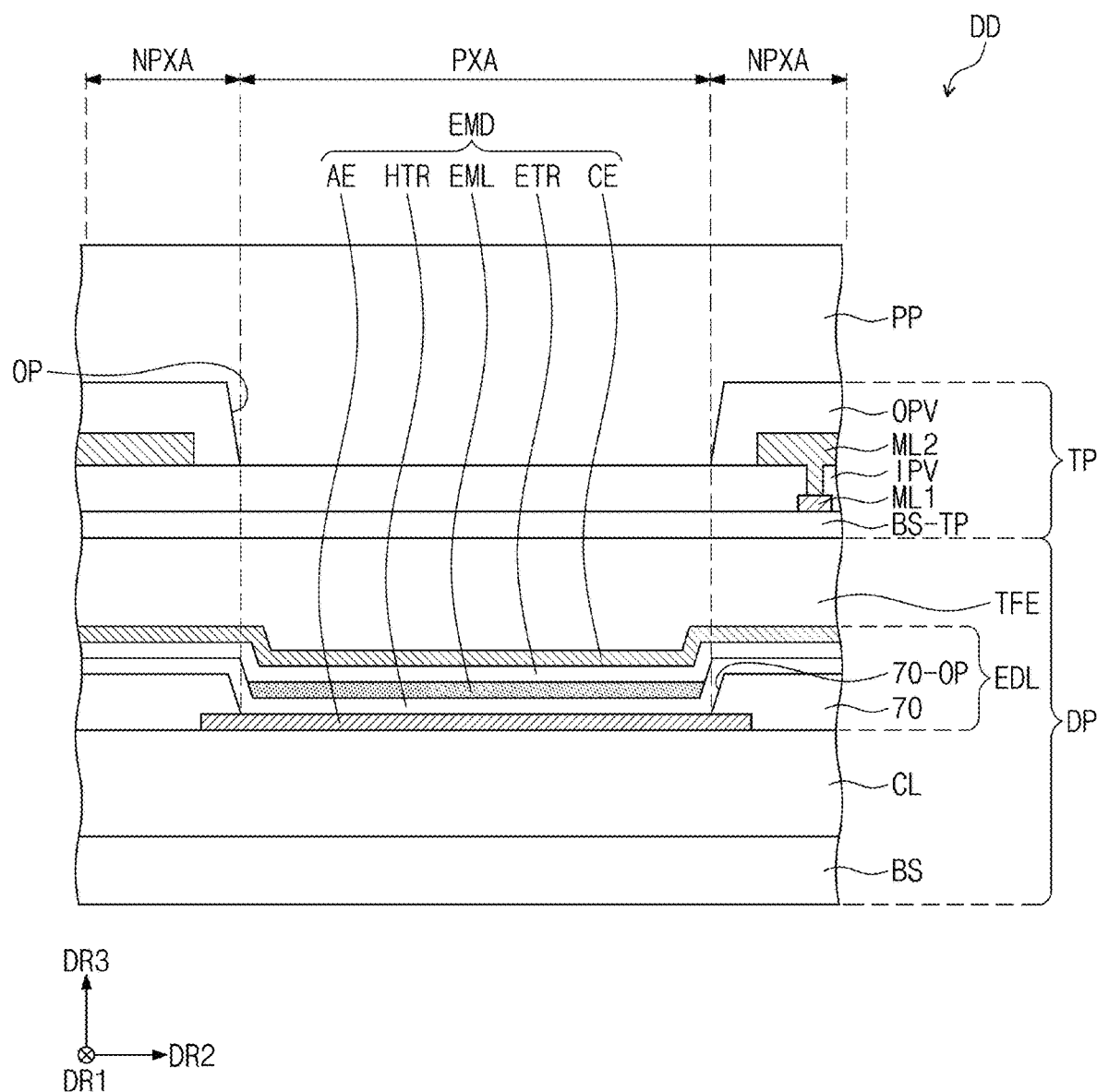
FIG. 3 is a cross-sectional view of a portion of an electronic device of area DD of FIG. 2 according to an embodiment of the present disclosure.

FIG. 1 is a perspective view showing an electronic device according to an embodiment. FIG. 2 is a cross-sectional view of an electronic device according to an embodiment. FIG. 3 is a cross-sectional view showing a portion of an electronic device according to an embodiment. FIG. 2 is a cross-sectional view schematically showing a portion corresponding to a line I-I' in FIG. 1, and FIG. 3 is a detailed cross-sectional view showing a DD area of FIG. 2.

Referring to FIG. 1 and FIG. 2, an electronic device ED according to an embodiment may be a device activated according to an electrical signal. For example, the electronic device ED may be a mobile phone, a tablet, a car navigation system, a game console, or a wearable device. For example, in FIG. 1 the electronic device ED is embodied as a mobile phone. However, embodiments of the present disclosure are not limited thereto and the electronic device ED may be various other small, medium or large sized electronic devices.

The electronic device ED may display an image through an active area AA. The active area AA may include a plane defined by a first directional axis DR1 and a second directional axis DR2. In an embodiment, the active area AA may further include a curved surface bent from at least one side of the plane defined by the first directional axis DR1 and the second directional axis DR2. The electronic device ED according to an embodiment shown in FIG. 1 includes two curved surfaces respectively bent from both opposing sides of the plane defined by the first directional axis DR1 and the second directional axis DR2. However, a shape of the active area AA is not limited thereto. For example, in an embodiment, the active area AA may extend only in the plane defined by the first and second directional axes DR1, DR2 and may not be bent. In an embodiment, the active area AA may further include at least two, for example, four curved surfaces respectively bent from four sides of the plane.

In FIG. 1, the first directional axis DR1, the second directional axis DR2, and a third directional axis DR3 are shown. However, the first to third directional axes DR1, DR2, and DR3 as described in the present disclosure may be relative to each other and may be exchangeable with each other. Further, directions as indicated by the first to third directional axes DR1, DR2, and DR3 may respectively correspond to first to third directions, and the same reference numeral may be assigned thereto.

In an embodiment, the first directional axis DR1 and the second directional axis DR2 may be orthogonal to each other. The third directional axis DR3 may be normal to a plane defined by the first directional axis DR1 and the second directional axis DR2. However, embodiments of the present disclosure are not limited thereto and the first to third directions DR1 to DR3 may cross each other at various different angles, respectively.

Further, in the present disclosure, an X-axis X and a Y-axis Y are illustrated. In an embodiment, the X-axis X and the Y-axis Y may be orthogonal to each other, and may or may not coincide with the first directional axis DR1 and the second directional axis DR2, respectively. For example, the X-axis (X) direction and the Y-axis (Y) direction may be orthogonal to each other and may be arbitrarily defined.

A thickness direction of the electronic device ED may refer to a direction parallel to the third directional axis DR3 which is a direction normal to the plane defined by the first directional axis DR1 and the second directional axis DR2. In an embodiment, a front surface (e.g., a top surface) and a rear surface (e.g., a bottom surface) of each of members constituting the electronic device ED may be defined based on the third directional axis DR3.

Referring to FIG. 1 to FIG. 3, the electronic device ED according to an embodiment may include a display panel DP and a sensor layer TP disposed on a top surface of the display panel DP. Further, the electronic device ED according to an embodiment may include an optical layer PP and a window WP disposed on the sensor layer TP. In an embodiment as shown in FIG. 2, an adhesive layer AP may be further disposed between the optical layer PP and the window WP (e.g., in the third direction DR3).

The display panel DP may include a base layer BS, a circuit layer CL disposed on the base layer BS, a display element layer EDL disposed on the circuit layer CL, and an encapsulation layer TFE disposed on the display element layer EDL. The encapsulation layer TFE may cover the display element layer EDL. In an embodiment, the encapsulation layer TFE may be disposed to surround the display element layer EDL to seal a light emitting element EMD (FIG. 3) of the display element layer EDL.

In the electronic device ED according to an embodiment, the display panel DP may be a light emitting display panel. For example, the display panel DP may be an organic electroluminescence display panel, or a quantum dot light emitting display panel. However, embodiments of the present disclosure are not limited thereto.

In an embodiment in which the display panel DP is an organic electroluminescence display panel, the display element layer EDL may include an organic electroluminescence element. Further, in an embodiment in which the display panel DP is a quantum dot light emitting display panel, the display element layer EDL may include a quantum dot light emitting element.

The sensor layer TP may be disposed on the display panel DP (e.g., in the third direction DR3). The sensor layer TP may sense an external input applied from an outside. In an embodiment, the external input may be an input from the user. The input from the user may include various types of external inputs, such as using a part of the user's body, light, heat, a pen, or a pressure.

In an embodiment, the sensor layer TP may be formed on the display panel DP using a successive process. In this embodiment, the sensor layer TP may be disposed directly on the display panel DP (e.g., in the third direction DR3). Being disposed directly may mean that a third component is not disposed between the sensor layer TP and the display panel DP. For example, a separate adhesive member may not be disposed between the sensor layer TP and the display panel DP (e.g., in the third direction DR3). For example, the sensor layer TP may be disposed directly on the encapsulation layer TFE in the third direction DR3.

The optical layer PP may be disposed on the sensor layer TP (e.g., disposed directly thereon in the third direction DR3). In an embodiment, the optical layer PP may include at least one of optical function layers such as an optical path control layer for changing an optical path, or an anti-reflective layer for reducing reflectance of external light incident from the outside. For example, in an embodiment, the optical layer PP may be a polarizing plate. In an embodiment, the optical layer PP may be a color filter layer.

The window WP may be disposed on the optical layer PP. In an embodiment, the window WP may act as a top layer of the electronic device ED. In an embodiment, the window WP may be a tempered glass substrate. The window WP may include a tempered surface to protect the sensor layer TP and the display panel DP from external impacts. The window WP according to an embodiment may further include a printed layer disposed on an inner or outer edge thereof.

The adhesive layer AP may be further disposed between the window WP and the optical layer PP (e.g., in the third direction DR3). In an embodiment, the adhesive layer AP may include an optically clear adhesive layer.

In the display panel DP, the base layer BS may be a member providing a base surface on which the display element layer EDL is disposed. In an embodiment, the base layer BS may be a glass substrate, a metal substrate, a polymer substrate, or the like. However, embodiments of the present disclosure is not limited thereto. The base layer BS may be an inorganic layer, a functional layer, or a composite material layer.

In an embodiment, the base layer BS may have a multi-layer structure. For example, the base layer BS may have a three-layer structure composed of a polymer resin layer, a barrier layer, and a polymer resin layer. In an embodiment, the polymer resin layer may include a polyimide-based resin. Further, the polymer resin layer may be to include at least one material selected from an acrylate-based resin, a (meth)acrylate-based resin, a polyisoprene-based resin, a vinyl-based resin, an epoxy-based resin, a urethane-based resin, a cellulose-based resin, a siloxane-based resin, the polyamide-based resin, and a perylene-based resin. In the present disclosure, "~-based" resin means containing a functional group of "~". The barrier layer may include an inorganic material.

The circuit layer CL may be disposed on the base layer BS (e.g., disposed directly thereon in the third direction DR3). In an embodiment, the circuit layer CL may include an insulating layer, a semiconductor pattern, a conductive pattern, and a signal line. In an embodiment, the insulating layer, the semiconductor layer, and the conductive layer may be formed on the base layer BS by coating, deposition, etc., and then, the insulating layer, the semiconductor layer, and the conductive layer may be selectively patterned using a plurality of photolithography processes. Thereafter, a semiconductor pattern, a conductive pattern, and a signal line included in the circuit layer CL may be formed.

In an embodiment, the circuit layer CL may include a transistor, a buffer layer, and a plurality of insulating layers. A first electrode AE may be electrically connected to the components of the circuit layer CL.

The display element layer EDL including the light emitting element EMD (FIG. 3) is disposed on the circuit layer CL (e.g., disposed directly thereon in the third direction DR3). In an embodiment, the display element layer EDL may include a pixel defining layer 70 and the light emitting element EMD.

As shown in FIG. 3, the light emitting element EMD may include the first electrode AE, a light emitting layer EML, and a second electrode CE. In an embodiment, the light emitting element EMD may further include a hole transport region HTR and an electron transport region ETR. In an embodiment, the light emitting element EMD may further include a capping layer disposed on the second electrode CE (e.g., disposed directly thereon in the third direction DR3).

An opening 70-OP is defined in the pixel defining layer 70. The opening 70-OP of the pixel defining layer 70 exposes at least a portion of the first electrode AE. For example, in an embodiment, the opening 70-OP may expose a central portion of the first electrode AE (e.g., in the second direction DR2). In this embodiment, a light-emissive area PXA is defined to correspond to a partial area of the first electrode AE exposed through the opening 70-OP. A non-light-emissive area NPXA may surround the light-emissive area PXA.

In an embodiment, the first electrode AE may be an anode or a cathode. Further, the first electrode AE may be a pixel electrode. In an embodiment, the first electrode AE may be a transmissive electrode, a semi-transmissive electrode, or a reflective electrode. In an embodiment in which the first electrode AE is a transmissive electrode, the first electrode AE may include a transparent metal oxide, for example, ITO (indium tin oxide), IZO (indium zinc oxide), ZnO (zinc oxide), ITZO (indium tin zinc oxide), or the like. However, embodiments of the present disclosure are not limited thereto. In embodiments in which the first electrode AE is the semi-transmissive electrode or the reflective electrode, the first electrode AE may include Ag, Mg, Cu, Al, Pt, Pd, Au, Ni, Nd, Ir, Cr, Li, Ca, LiF/Ca, LiF/Al, Mo, Ti, W, or a compound or a mixture thereof (e.g., a mixture of Ag and Mg). In an embodiment, the first electrode AE may have a multi-layer structure including a transparent conductive film. For example, the first electrode AE may have a three-layer structure of ITO/Ag/ITO. However, embodiments of the present disclosure are not limited thereto.

The hole transport region HTR may be disposed between the first electrode AE and the light emitting layer EML (e.g., in the third direction DR3). In an embodiment, the hole transport region HTR may be a common layer overlapping an entirety of the light-emissive area PXA and an entirety of the non-light-emissive area NPXA. However, embodiments of the present disclosure is not limited thereto. For example, in an embodiment, the hole transport region HTR may be patterned so as to overlap the light-emissive area PXA and to not overlap at least a portion of the non-light-emissive area NPXA. The hole transport region HTR may include at least one layer selected from a hole injection layer, a hole transport layer, or an electron blocking layer.

The light emitting layer EML is disposed on the hole transport region HTR (e.g., disposed directly thereon in the third direction DR3). The light emitting layer EML may be disposed in the opening 70-OP. For example, in an embodiment, the light emitting layer EML may be formed in a separate manner so as to correspond to the light-emissive area PXA defined by the pixel defining layer 70 and the light emitting layer EML may not be formed in the non-light-emissive area NPXA. However, embodiments of the present disclosure are not limited thereto. In an embodiment in which each light emitting layer EML is formed separately in each opening 70-OP, each light emitting layer EML may emit light of at least one of blue, red, or green. However, embodiments of the present disclosure are not limited thereto and the colors emitted by the light emitting layer EML may vary. Additionally, in an embodiment, the light emitting layer EML may be commonly provided to overlap the entirety of the light-emissive area PXA and the entirety of the non-light-emissive area NPXA. In an embodiment, the light emitting layer EML may provide blue light or white light.

In an embodiment, the light emitting layer EML may include a fluorescent or phosphorescent material that emits red, green, or blue light. Further, the light emitting layer EML may include a metal-organic complex as the light emitting material. In an embodiment, the light emitting layer EML may include a quantum dot as the light emitting material.

The electron transport region ETR may be disposed between the light emitting layer EML and the second electrode CE (e.g., in the third direction DR3). In an embodiment, the electron transport region ETR may be a common layer that overlaps the entirety of the light-emissive area PXA and the entirety of the non-light-emissive area NPXA. However, embodiments of the present disclosure is not limited thereto. For example, the electron transport region ETR may be patterned so as to overlap the light-emissive area PXA and to not overlap at least a portion of the non-light-emissive area NPXA. In an embodiment, the electron transport region ETR may include at least one layer selected from an electron injection layer, an electron transport layer, or a hole blocking layer.

The second electrode CE is disposed on the electron transport region ETR (e.g., disposed directly thereon in the third direction DR3). In an embodiment, the second electrode CE may be a common electrode. In an embodiment, the second electrode CE may be a cathode or an anode. However, embodiments of the present disclosure are not limited thereto. For example, in an embodiment in which the first electrode AE is an anode, the second electrode CE may be the cathode. In an embodiment in which the first electrode AE is the cathode, the second electrode CE is the anode.

In an embodiment, the second electrode CE may be a transmissive electrode, a semi-transmissive electrode, or a reflective electrode. In embodiments in which the second electrode CE is the transmissive electrode, the second electrode CE may be made of a transparent metal oxide, for example, ITO (indium tin oxide), IZO (indium zinc oxide), ZnO (zinc oxide), ITZO (indium tin zinc oxide), or the like. However, embodiments of the present disclosure are not limited thereto.

The encapsulation layer TFE may be disposed on the light-emitting element EMD. For example, in an embodiment, the encapsulation layer TFE may be disposed on the second electrode CE (e.g., disposed directly thereon in the third direction DR3). However, embodiments of the present disclosure are not limited thereto. For example, in an embodiment in which the light emitting element EMD includes a capping layer, the encapsulation layer TFE may be disposed on the capping layer (e.g., disposed directly thereon in the third direction DR3).

In an embodiment of the electronic device ED, the encapsulation layer TFE may have a low dielectric constant value. For example, in the electronic device ED according to an embodiment, the encapsulation layer TFE has a low dielectric constant value in a range of about 3.0 or lower, thereby reducing a capacitance value between the sensor layer TP and the light emitting element EMD under the encapsulation layer TFE so that the sensor layer TP has increased sensitivity characteristics. The encapsulation layer TFE according to an embodiment will be described in more detail later.

The sensor layer TP may be disposed on the encapsulation layer TFE. In an embodiment, the sensor layer TP may be disposed directly on the encapsulation layer TFE (e.g., in the third direction DR3). However, embodiments of the present disclosure are not limited thereto. The sensor layer TP may include a sensor base layer BS-TP disposed on an upper surface of the encapsulation layer TFE (e.g., disposed directly thereon in the third direction DR3), a first conductive layer ML1 disposed on the sensor base layer BS-TP, a first insulating layer IPV disposed on the sensor base layer BS-TP and the first conductive layer ML1, a second conductive layer ML2 disposed on the first insulating layer IPV and contacting the first conductive layer ML1 through a via hole extending through the first insulating layer IPV, and a second insulating layer OPV disposed on the first insulating layer IPV and the second conductive layer ML2.

In an embodiment, the sensor base layer BS-TP may include an inorganic layer including at least one compound selected from silicon nitride, silicon oxynitride, and silicon oxide. However, embodiments of the present disclosure are not limited thereto. For example, in an embodiment, the sensor base layer BS-TP may include an organic layer including an epoxy-based resin, an acrylic-based resin, or an imide-based resin. The sensor base layer BS-TP may have a single-layer structure or a multi-layer structure in which layers are stacked along the third direction DR3. In an embodiment, the sensor base layer BS-TP may be disposed directly on the encapsulation layer TFE. However, embodiments of the present disclosure are not limited thereto. For example, in an embodiment, the sensor base layer BS-TP may be omitted.

Each of the first conductive layer ML1 and the second conductive layer ML2 may have a single-layer structure or a multi-layer structure in which layers are stacked along the third direction DR3. Each of the first and second conductive layers ML1 and ML2 having the single-layer structure may include a metal layer or a transparent conductive layer. In an embodiment, the metal layer may include molybdenum, silver, titanium, copper, aluminum, or alloys thereof. The transparent conductive layer may include a transparent conductive oxide such as indium tin oxide (ITO), indium zinc oxide (IZO), zinc oxide (ZnO), indium zinc tin oxide (IZTO), or the like. Further, the transparent conductive layer may include a conductive polymer such as PEDOT, a metal nanowire, graphene, and the like. However, embodiments of the present disclosure are not limited thereto.

Each of the first and second conductive layers ML1 and ML2 having the multi-layer structure may include metal layers. The metal layers may include three metal layers, for example, titanium (Ti) layer/aluminum (Al) layer/titanium (Ti) layer. Each of the first and second conductive layers ML1 and ML2 having the multi-layer structure may include at least one metal layer and at least one transparent conductive layer.

In an embodiment, each of the first insulating layer IPV and the second insulating layer OPV may independently include at least one of an inorganic material or an organic material.

In an embodiment, the first insulating layer IPV may be an inorganic insulating layer including an inorganic material. For example, the first insulating layer IPV may include at least one compound selected from aluminum oxide, titanium oxide, silicon oxide, silicon oxynitride, zirconium oxide, or hafnium oxide.

In an embodiment, the second insulating layer OPV may be an organic insulating layer including an organic material. For example, the second insulating layer OPV may include at least one material selected from an acrylate-based resin, a (meth)acrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

A pixel opening OP may be defined in a portion of the second insulating layer OPV. The pixel opening OP may be arranged to overlap the light-emissive area PXA. A top surface of the first insulating layer IPV may be exposed through the pixel opening OP.

The optical layer PP may be disposed on the second insulating layer OPV. In an embodiment in which the optical layer PP is a color filter layer, the optical layer PP may fill the pixel opening OP.

Figure 4:
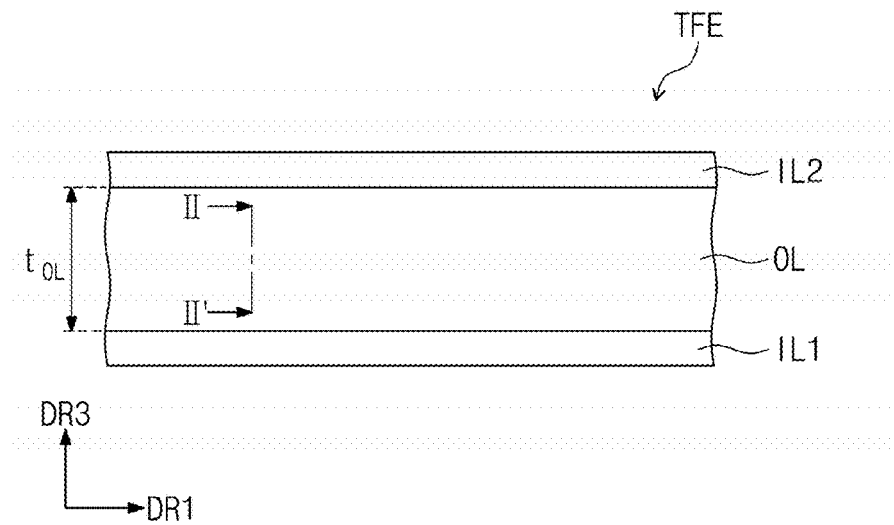
FIG. 4 is a cross-sectional view of an encapsulation layer according to an embodiment of the present disclosure.
Figure 5:
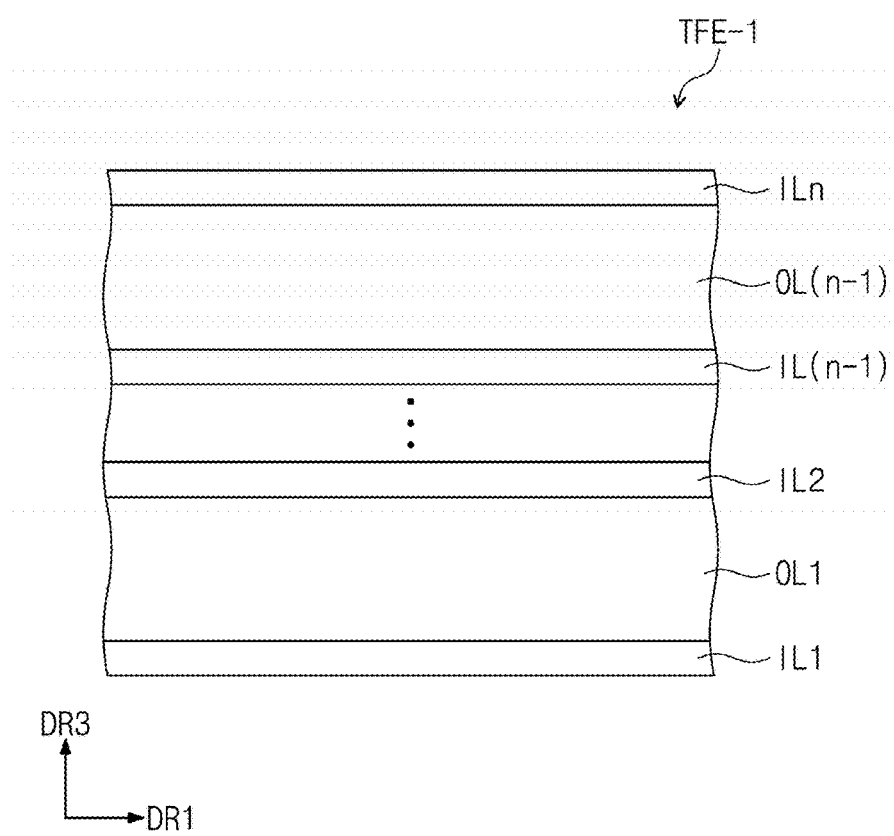
FIG. 5 is a cross-sectional view of an encapsulation layer according to an embodiment of the present disclosure.

FIG. 4 and FIG. 5 are cross-sectional views showing encapsulation layers according to embodiments of the present disclosure, respectively. Each of the encapsulation layers TFE and TFE-1 may include at least one inorganic layer and at least one organic layer.

Referring to FIG. 4, in an embodiment, the encapsulation layer TFE may include one organic layer OL and two inorganic layers, such as first and second inorganic layers IL1 and IL2, wherein the first and second inorganic layers IL1 and IL2 and the organic layer OL may be alternately arranged with each other (e.g., in the third direction DR3). For example, the encapsulation layer TFE may include the first and second inorganic layers IL1 and IL2 and the organic layer OL disposed between the first and second inorganic layers IL1 and IL2 (e.g., in the third direction DR3). The first inorganic layer IL1, the organic layer OL, and the second inorganic layer IL2 may protect the display element layer EDL (FIG. 3) from moisture/oxygen, and prevent foreign materials, such as dust particles, etc., from penetrating into the display element layer EDL.

In an embodiment, each of the first inorganic layer IL1 and the second inorganic layer IL2 may include at least one compound selected from silicon nitride, silicon oxynitride, or silicon oxide. In an embodiment, each of the first inorganic layer IL1 and the second inorganic layer IL2 may include titanium oxide or aluminum oxide. However, embodiments of the present disclosure are not limited thereto.

The organic layer OL may include an organic polymer material. A thickness $t_{OL}$ of the organic layer OL (e.g., length in the third direction DR3) may be relatively larger than a thickness (e.g., length in the third direction DR3) of each of neighboring first and second inorganic layers IL1 and IL2. For example, in an embodiment, the thickness $t_{OL}$ of the organic layer OL may be in a range of about 5 μm to about 15 μm. However, embodiments of the present disclosure are not limited thereto.

In embodiments in which the thickness $t_{OL}$ of the organic layer OL is greater than about 15 μm, an overall thickness of the encapsulation layer TFE increases. In this case, stress may be applied to the first and second inorganic layers IL1 and IL2 adjacent to the organic layer OL, thereby causing cracks in the first and second inorganic layers IL1 and IL2. The occurrence of cracks may increase when an electronic device has a bending shape at an edge portion thereof. Further, in embodiments in which the thickness $t_{OL}$ of the organic layer OL is less than about 5 μm, it may be difficult for the encapsulation layer TFE to protect the light emitting element EMD (FIG. 3) which is disposed under the encapsulation layer TFE.

The encapsulation layer TFE-1 according to an embodiment shown in FIG. 5 is the same as the encapsulation layer TFE of FIG. 4 except that the embodiment in FIG. 5 includes a plurality of inorganic layers, such as first to n inorganic layers IL1 to ILn in which n is an integer greater than or equal to 4 and a plurality of organic layers, such as first to n−1 organic layers OL1 to OL n−1. In contrast, the encapsulation layer TFE of FIG. 4 includes first and second inorganic layers IL1, IL2 (e.g., n inorganic layers in which n is 2) and one organic layer OL (e.g., n−1 organic layers in which n is 2).

The organic layer OL described with reference to FIG. 4 (and at least one of the first to n−1 organic layers OL1 to OL n−1 as described with reference to FIG. 5) may include a polymer having a relatively large molecular anisotropy, such as in comparison to a conventional organic layer. For example, the greater a difference between lengths of a virtual three-dimensional shape of a single polymer in a major axis direction and a minor axis direction, the greater the molecular anisotropy.

Figure 6:
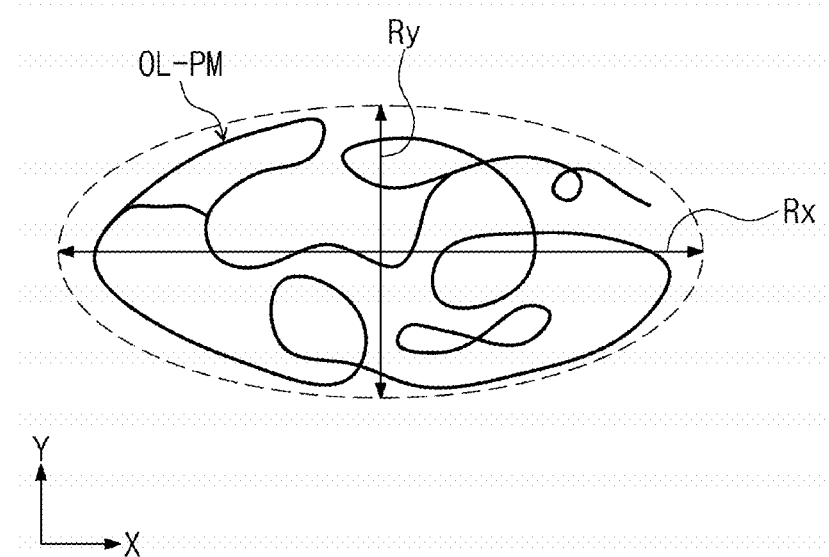
FIG. 6 is a schematic diagram of a polymer according to an embodiment of the present disclosure.

FIG. 6 shows a schematic three-dimensional shape of a polymer included in the organic layer OL (FIG. 4) according to an embodiment. Referring to FIG. 6, a polymer OL-PM included the organic layer OL (FIG. 4) according to an embodiment may have a three-dimensional shape that is substantially oval. For example, the polymer OL-PM included in the organic layer OL (FIG. 4) according to an embodiment may have a shape in which a molecular length Rx in an X-axis (X direction) is relatively larger than a molecular length Ry in a Y-axis (Y direction). For example, the polymer OL-PM included in the organic layer OL (FIG. 4) according to an embodiment may have an anisotropic shape in which the molecular length in the major axis direction and the molecular length in the minor axis direction are different from each other. However, the three-dimensional shape of the polymer OL-PM included in the organic layer OL (FIG. 4) according to embodiments of the present disclosure is not limited to that shown in FIG. 6 and may vary. For example, the three-dimensional shape of the polymer OL-PM according to an embodiment may have a non-spherical anisotropic shape in which the molecular length in one direction is larger than the molecular length in another direction by a certain value. In an embodiment, the three-dimensional shape of the polymer OL-PM may be substantially oval and the molecular length Ry in the Y direction may be relatively larger than the molecular length Rx in the X direction.

In the encapsulation layer TFE according to an embodiment shown in FIG. 4, the organic layer OL may include a polymer material having a relatively large molecular anisotropy, such as in comparison to a conventional organic layer. Thus, the organic layer OL may have a low dielectric constant value as compared to a conventional organic layer including a polymer having a relatively small molecular anisotropy.

The organic layer OL of the encapsulation layer TFE according to an embodiment may include a (meth)acrylate-based polymer. In an embodiment, the (meth)acrylate based polymer represents an acrylate based polymer or a methacrylate based polymer.

In an embodiment, the organic layer OL of the encapsulation layer TFE may include a polymer produced using (e.g., composed of) a composition including a dimethacrylate compound, a (meth)acrylate compound, and a photo-initiator. In an embodiment, the composition may further include a cross-linker. For example, the organic layer OL according to an embodiment may include a polymer produced using a composition including a dimethacrylate compound, a (meth)acrylate compound, a photo-initiator, and an acrylate-based cross-linker.

The composition according to an embodiment may include a dimethacrylate monomer, a (meth)acrylate monomer, a photo-initiator, and an acrylate-based cross-linker. In an embodiment, the organic layer OL may be produced via a polymerization reaction and a crosslinking reaction of the composition.

In an embodiment, the dimethacrylate compound included in the composition may include an alkylene group having 10 or more carbon atoms between two methacrylate moieties. For example, in an embodiment, the dimethacrylate compound may have a methacrylate group at each of both sides thereof using an alkylene group having 14 or more carbon atoms as a linker. However, embodiments of the present disclosure are not limited thereto.

In an embodiment, the (meth)acrylate compound included in the composition may include an alkyl group having 10 or more carbon atoms as a substituent. For example, in an embodiment, the (meth)acrylate compound included in the composition may include one (meth)acrylate moiety and a plurality of alkyl groups as substituents, each alkyl group having 10 or more carbon atoms.

In an embodiment, the photo-initiator included in the composition may be activated using ultraviolet light. For example, in an embodiment, the photo-initiator may include TPO (2,4,6-trimethylbenzoyldiphenyl phosphine oxide). However, embodiments of the present disclosure is not limited thereto.

In an embodiment, the composition may include PTMA (trimethylolpropane trimethacrylate) as the cross-linker. In an embodiment, the encapsulation layer TFE may include the organic layer OL produced via a crosslinking bond between polymers or a crosslinking bond between adjacent functional groups in one polymer.

In an embodiment, the composition may include the dimethacrylate compound in a range of about 50 wt % to about 90 wt %, the (meth)acrylate compound in a range of about 0 wt % to about 40 wt %, and the photo-initiator in a range of about 1 wt % to about 10 wt % based on a total weight (e.g., 100 wt %) of the composition. In an embodiment, the composition may further include PTMA as the cross-linker.

Figure 7:
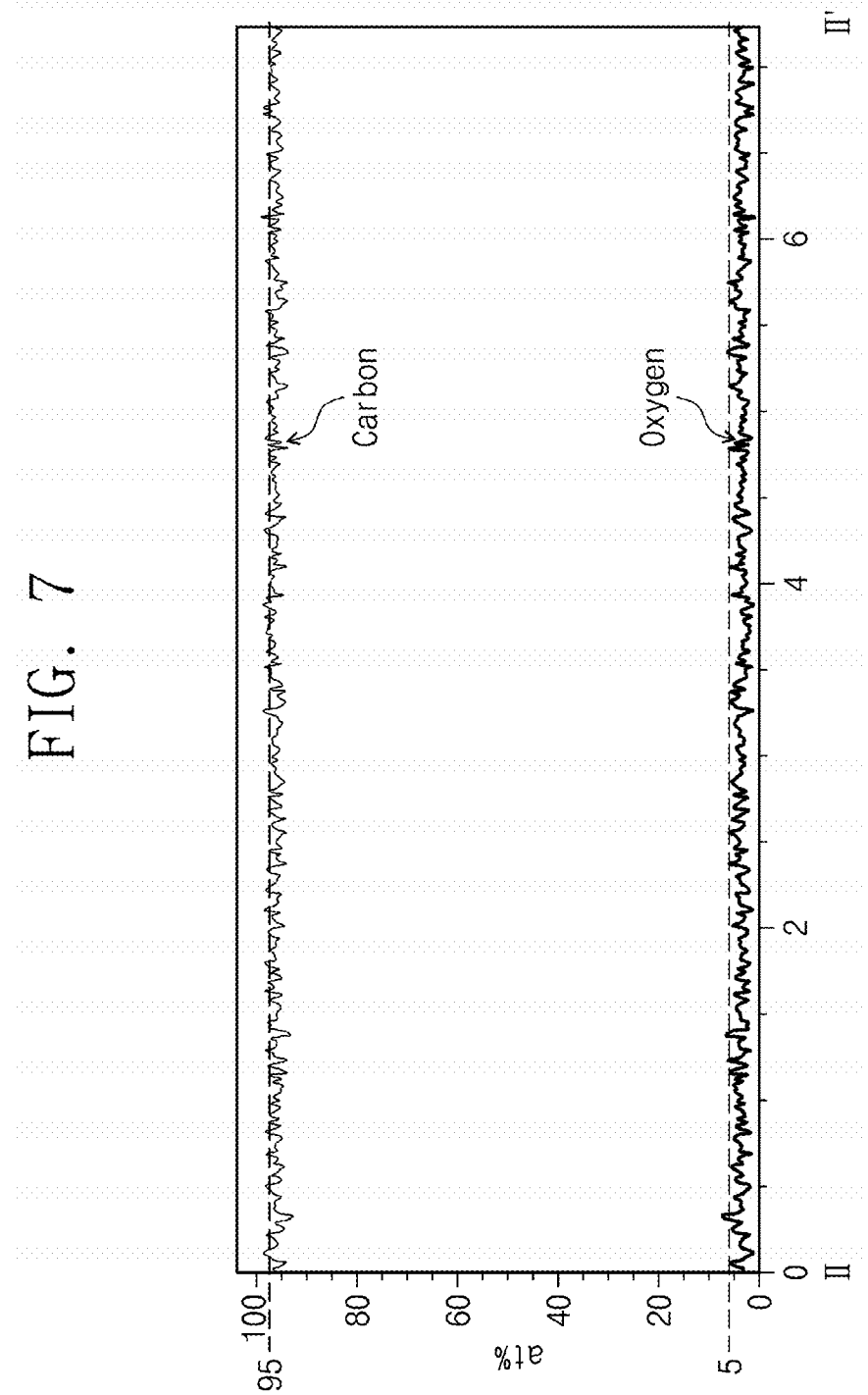
FIG. 7 is a component analysis graph of an organic layer as measured along line II-II' of FIG. 4 according to an embodiment of the present disclosure.

FIG. 7 is a component analysis graph of an organic layer according to an embodiment. FIG. 7 shows an element concentration in the organic layer according to an embodiment. FIG. 7 shows element concentrations (at %) of carbon atoms and oxygen atoms as measured along a line II-II' in FIG. 4. Referring to FIG. 7, the organic layer OL (FIG. 4) according to an embodiment may have an oxygen atom of less than or equal to about 5 at % based on a total content of the organic layer OL. Further, it may be identified that a content of carbon atoms is about 95 at % based on the total content of the organic layer OL (FIG. 4). For example, the organic layer OL produced using the composition (FIG. 4) according to an embodiment of the present disclosure has a low oxygen atom content of about 5 at % or lower. Thus, the organic layer produced using the composition according to an embodiment of the present disclosure may form the material of the encapsulation layer TFE (FIG. 4).

In the encapsulation layer TFE shown in FIG. 4, the organic layer OL may include a polymer produced using (e.g., a polymer composed of) the above-described composition according to an embodiment of the present disclosure, and thus, the organic layer OL may include the polymer having a molecular anisotropy greater than or equal to about 1.4. For example, the molecular anisotropy of the polymer included in the organic layer OL may be in a range of about 1.4 to about 1.9. In embodiments in which the molecular anisotropy of the polymer is lower than about 1.4, a free volume in the polymer is not sufficiently secured, and the dielectric constant of the organic layer OL may not be sufficiently reduced. Further, when the molecular anisotropy of the polymer is greater than about 1.9, a strength of the polymer may decrease as the number of carbons between the cross-linking bonds increases. Therefore, when the molecular anisotropy of the polymer included in the organic layer OL is in a range of about 1.4 to about 1.9, the polymer may have a sufficient free volume portion in a molecule of the polymer and thus may have the relatively low dielectric constant value, and at the same time, may maintain the strength characteristics that may be used in the organic layer OL.

Figure 8:
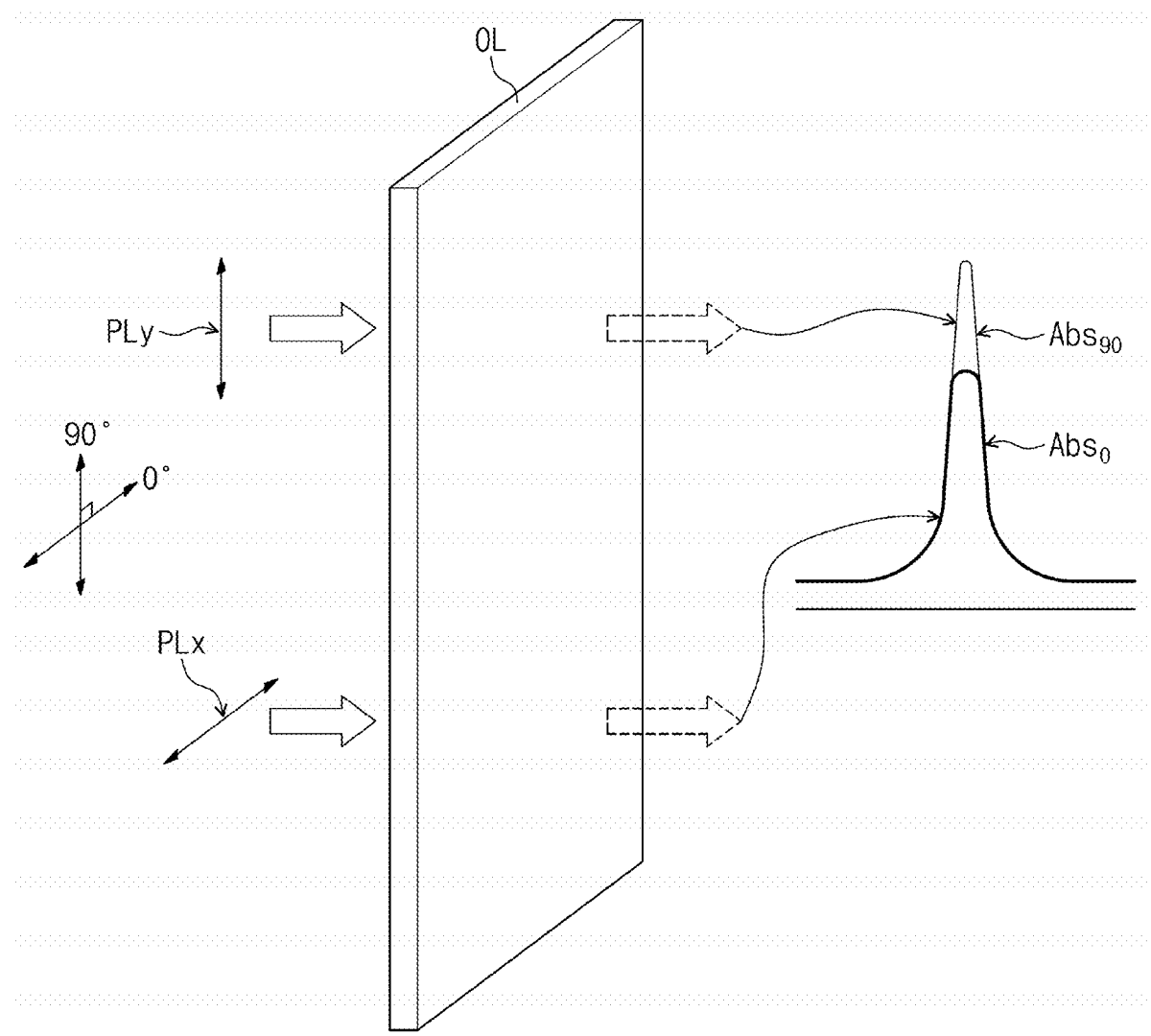
FIG. 8 shows an FT-IR analysis method using polarization according to an embodiment of the present disclosure.

As shown in FIG. 8, the molecular anisotropy may be measured using FT-IR (Fourier-transform infrared spectroscopy) using an infrared spectrometer. FIG. 8 is a diagram schematically showing a polarized measurement mode using FT-IR. As shown in FIG. 8, first polarized light PLx polarized in a first direction (for example, 0° direction) was provided and transmitted through the organic layer OL. A first absorption peak ($Abs_0$) in a polarized infrared spectrum measured in the polarized measurement mode of FT-IR was then measured. At that same time, second polarized light PLy polarized in a second direction (for example, 90° direction) was provided and transmitted through the organic layer OL. Then, a second absorption peak ($Abs_{90}$) in a polarized infrared spectrum measured in the polarized measurement mode of FT-IR was measured. A ratio between the first absorption peak ($Abs_0$) and the second absorption peak ($Abs_{90}$) was then defined as the molecular anisotropy. In an embodiment, the first direction and the second direction may be orthogonal to each other. However, embodiments of the present disclosure are not limited thereto.

In an embodiment, the molecular anisotropy may be defined using following Equation 1.

$$\text{Molecular anisotropy} = Abs_{90}/Abs_0 \qquad \text{[Equation 1]}$$

Each of $Abs_{90}$ and $Abs_0$ in the above Equation 1 represents a peak value at 2925 cm$^{-1}$ among FT-IR peaks. $Abs_0$ indicates a peak value at 2925 cm$^{-1}$ for the organic layer OL when the provided light is polarized in the first direction. $Abs_{90}$ indicates a peak value at 2925 cm$^{-1}$ for the organic layer OL when the provided light is polarized in the second direction perpendicular to the first direction. However, the terms first and second directions are nominal and embodiments of the present disclosure are not limited thereby. In one example, the peak value at 2925 cm$^{-1}$ corresponds to a stretching vibration peak of a C—H bond of an aliphatic hydrocarbon compound. Further, in the above Equation 1, $Abs_{90}$ is greater than or equal to $Abs_0$.

In embodiments in which $Abs_0$ is greater than or equal to $Abs_{90}$, the molecular anisotropy may be defined as "$Abs_0/Abs_{90}$".

Figure 9A:
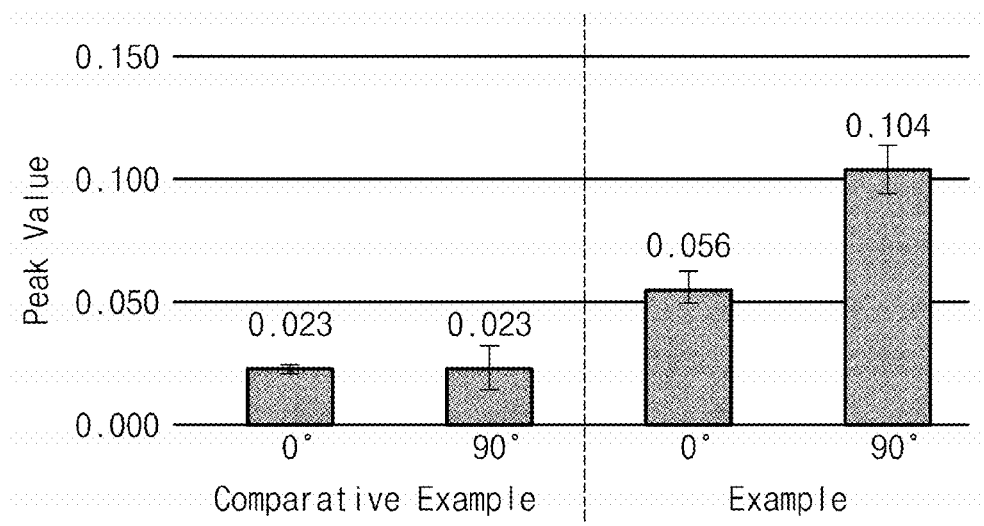
FIG. 9A shows FT-IR analysis results of Comparative Example and Example according to an embodiment of the present disclosure.

FIG. 9A shows a comparison of infrared spectrum in an infrared spectroscopy peak values in a comparative example ("Comparative Example") and an example embodiment of the present disclosure ("Example"). In FIG. 9A, 0° indicates an absorbance measured when the light PLx polarized in the 0° direction (FIG. 8) is provided. 90° indicates an absorbance measured when the light PLy polarized in the 90° direction (FIG. 8) is provided. In an embodiment, Example in FIG. 9A is related to the organic layer produced using the composition according to an embodiment of the present disclosure as described above, whereas Comparative Example in FIG. 9A is related to an organic layer including a polymer material produced using a monomer in which the number of aliphatic hydrocarbons is less than that of Example.

Referring to FIG. 9A, in Comparative Example, the FT-IR peak values in the 0° direction and the 90° direction had similar levels, while in Example, the FT-IR peak value in the 90° direction was significantly larger than the FT-IR peak value in the 0° direction.

Figure 9B:
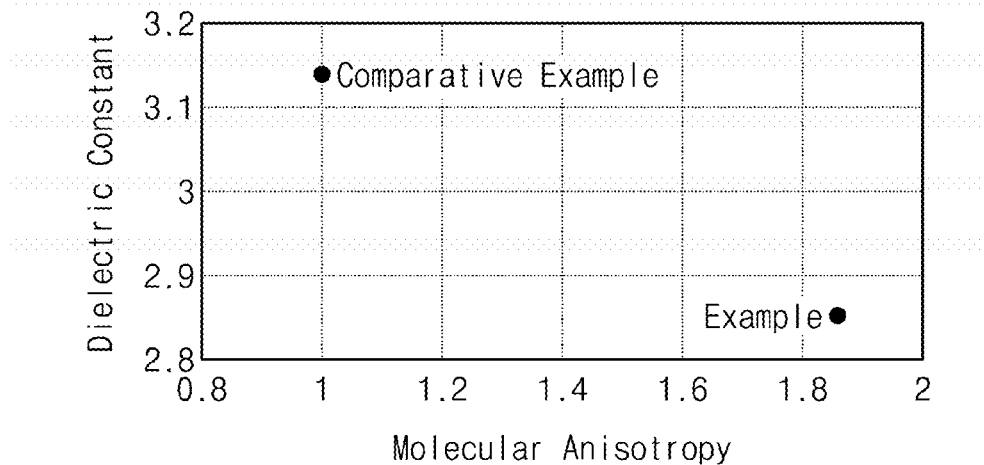
FIG. 9B shows a dielectric constant of each of Comparative Example and Example according to an embodiment of the present disclosure.

FIG. 9B shows comparisons of molecular anisotropy values and dielectric constant values in organic layers of Comparative Example and Example, respectively. Comparative Example and Example in FIG. 9B correspond to the organic layers of Comparative Example and Example showing the polarized infrared spectra shown in FIG. 9A, respectively.

FIG. 9B shows the dielectric constant value based on the molecular anisotropy. It may be seen based on FIG. 9B that molecular anisotropy in Comparative Example is equal to about 1 while the molecular anisotropy in Example is equal to about 1.86. The organic layer according to an embodiment includes the polymer produced using the composition according to an embodiment of the present disclosure, wherein the composition includes monomeric compounds, each having an aliphatic hydrocarbon bond having a relatively long chain. Accordingly, it may be identified that Example exhibits a greater molecular anisotropy than that of Comparative Example.

Further, it may be seen that Example having a relatively larger molecular anisotropy exhibits a lower dielectric constant value than that of Comparative Example. For example, as shown in FIG. 9, Comparative Example exhibits a dielectric constant value of about 3.14 whereas Example exhibits a dielectric constant value of about 2.85. Therefore, Example exhibits decrease of about 10% in the dielectric constant compared to that of Comparative Example.

Therefore, referring to FIGS. 9A and 9B, the organic layer according to an embodiment produced using the composition according to an embodiment of the present disclosure that includes the monomer compound having the aliphatic hydrocarbon bond having the relatively long chain length may include a polymer material having a greater molecular anisotropy than Comparative Example. Further, it may be seen that the organic layer according to an embodiment of the present disclosure including the polymer material with the relatively large molecular anisotropy exhibits a relatively low dielectric constant value.

In an embodiment, the organic layer OL (FIG. 4) may have a dielectric constant that is less than or equal to about 3. For example, in an embodiment, the organic layer OL (FIG. 4) according to an embodiment may include a (meth)acrylate-based polymer, and may have a dielectric constant in a range of about 2.6 to about 3.0. For example, the organic layer OL (FIG. 4) according to an embodiment may have a dielectric constant value that is greater than or equal to about 2.6 which is a characteristic of an acrylate-based material, and may have a dielectric constant value less than or equal to about 3 due to the structural characteristic (the three-dimensional shape having the anisotropy) of the (meth)acrylate-based polymer included in the organic layer OL.

Figure 10A:
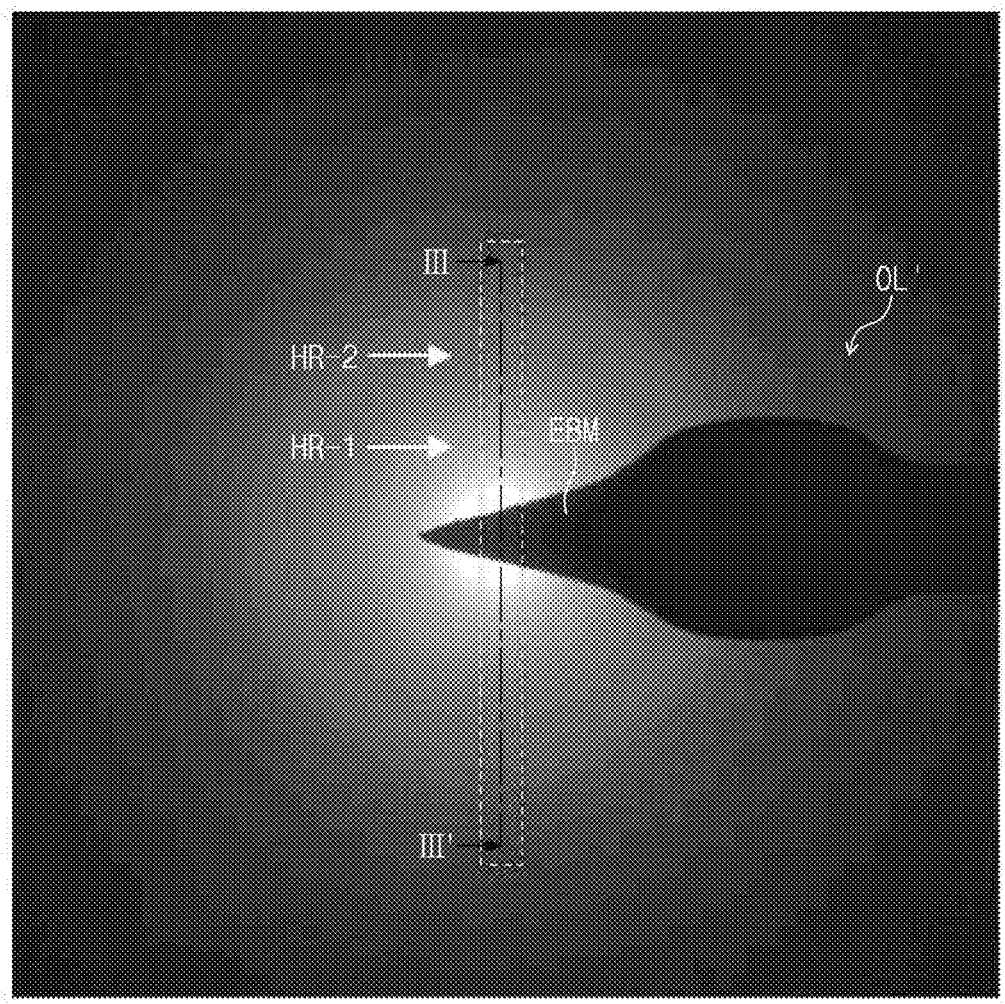
FIG. 10A shows an electron diffraction pattern of Comparative Example.
Figure 10A:
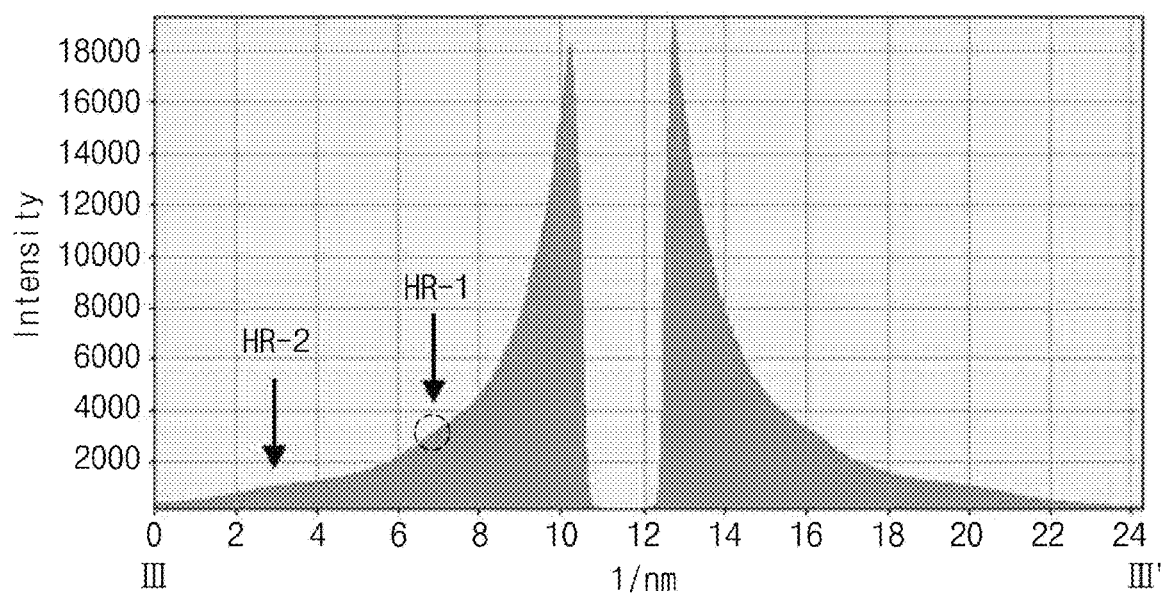
Figure 10B:
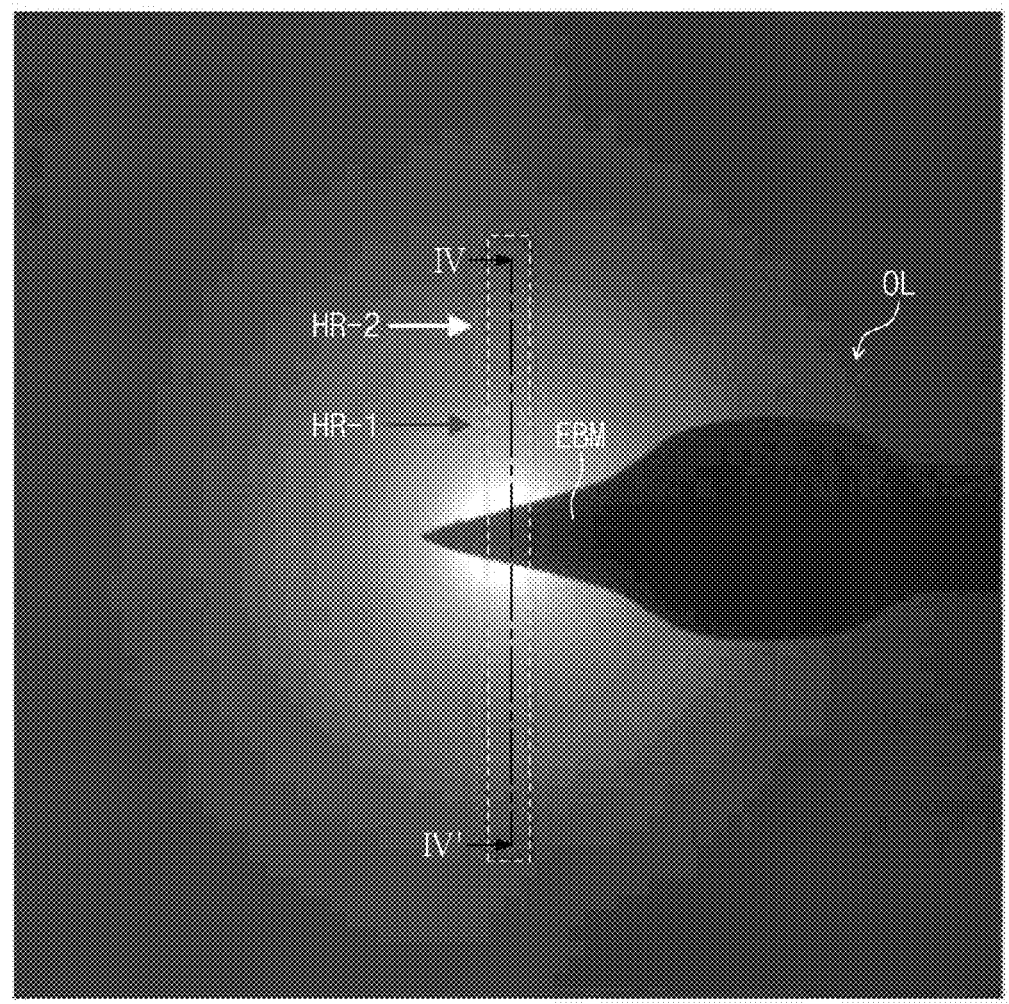
FIG. 10B shows an electron diffraction pattern of Example according to an embodiment of the present disclosure.
Figure 10B:
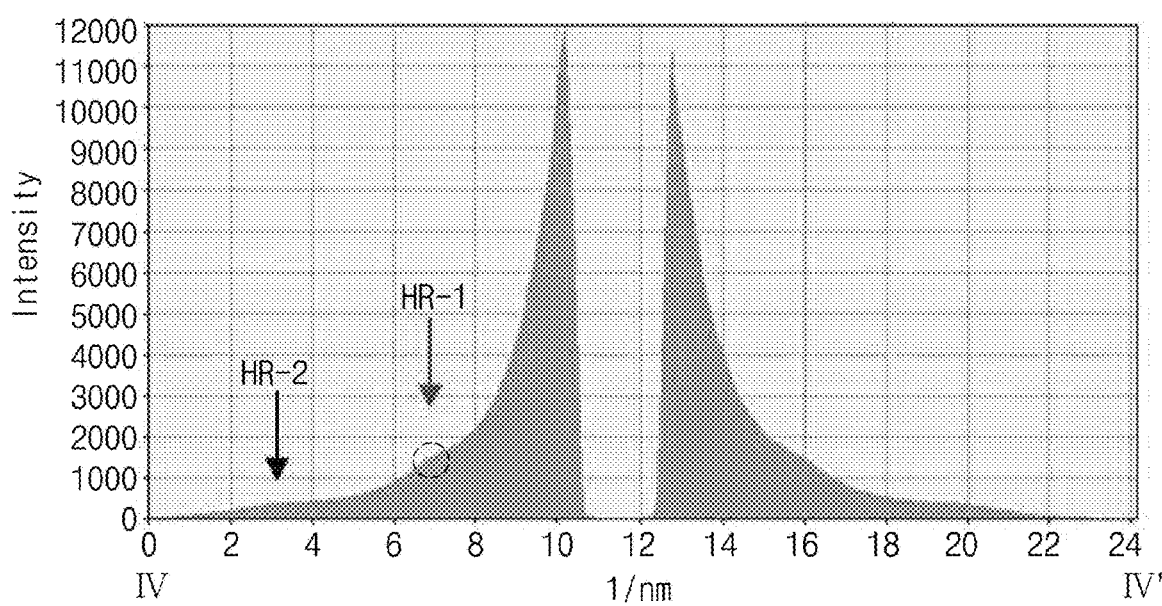

FIG. 10A and FIG. 10B show results of analysis using an electron diffraction method, respectively. FIG. 10A shows a diffraction pattern when an electron beam EBM is provided to an organic layer OL' of Comparative Example. FIG. 10B shows a diffraction pattern when an electron beam EBM is provided to the organic layer OL of Example.

FIG. 10A shows an image obtained using the electron diffraction analysis on the organic layer OL' of Comparative Example, and a profile of an intensity of light in a portion corresponding to a III-III' line of the image. Further, FIG. 10B shows an image obtained using the electron diffraction analysis on the organic layer OL of Example, and a profile of an intensity of light in a portion corresponding to a line IV-IV' of the image. The organic layers OL' and OL of Comparative Example and Example in FIG. 10A and FIG. 10B correspond to the organic layers of Comparative Example and Example as described with reference to FIG. 9A and FIG. 9B, respectively.

Referring to FIG. 10A and FIG. 10B, each of the organic layers OL' and OL of Comparative Example and Example had amorphous characteristics, and thus a ring pattern (e.g., a hollow ring) was shown in the image obtained using the electron diffraction analysis on each of the organic layers OL' and OL of Comparative Example and Example. In FIG. 10A and FIG. 10B, the image related to each of Comparative Example and Example had both a first ring pattern HR-1 and a second ring pattern HR-2.

In an embodiment, referring to FIG. 10A and FIG. 10B, it may be seen that a diffraction intensity of the first ring pattern HR-1 in Example is greater than the diffraction intensity of the first ring pattern HR-1 in Comparative Example. In the present disclosure, the diffraction intensity corresponds to the degree of deformation at the inflection point of intensity. Therefore, it may be identified using the electron diffraction method that the molecular anisotropy of the polymer included in the organic layer of Example is larger than that of Comparative Example.

The organic layer OL of the encapsulation layer TFE according to an embodiment shown in FIG. 4 may have a glass transition temperature in a range of about −28° C. to about 1.40° C. Table 1 below shows glass transition values of Comparative Example and Example. Comparative Example and Example in Table 1 correspond to the organic layers of Comparative Example and Example used in the evaluation of FIG. 9A and FIG. 9B, respectively.

TABLE 1

| Examples | Glass transition temperature (° C.) |
|---|---|
| Comparative Example | 56.12 |
| Example | 1.40 |

For example, it may be seen in Table 1 that Example exhibits a lower glass transition temperature, compared to that of Comparative Example because Example includes the polymer material having a relatively large molecular anisotropy due to an increase in a content of aliphatic hydrocarbons. The dimethacrylate compound included in the composition according to an embodiment of the present disclosure may include an alkylene group having 10 or more carbon atoms between the two methacrylate moieties. Thus, the free volume in the polymer produced using the composition according to an embodiment of the present disclosure may increase, and the organic layer OL in Example may have a lower glass transition temperature in a range of about −28° C. to about 1.40° C.

Further, the organic layer OL according to an embodiment includes the polymer produced using the composition according to an embodiment of the present disclosure. The molecular anisotropy of the polymer is greater than or equal to about 1.4, and the glass transition temperature thereof is less than or equal to about 1.40° C. Thus, the polymer may exhibit a low dielectric constant value, such as in a range of about 2.6 to about 3.0.

Figure 11A:
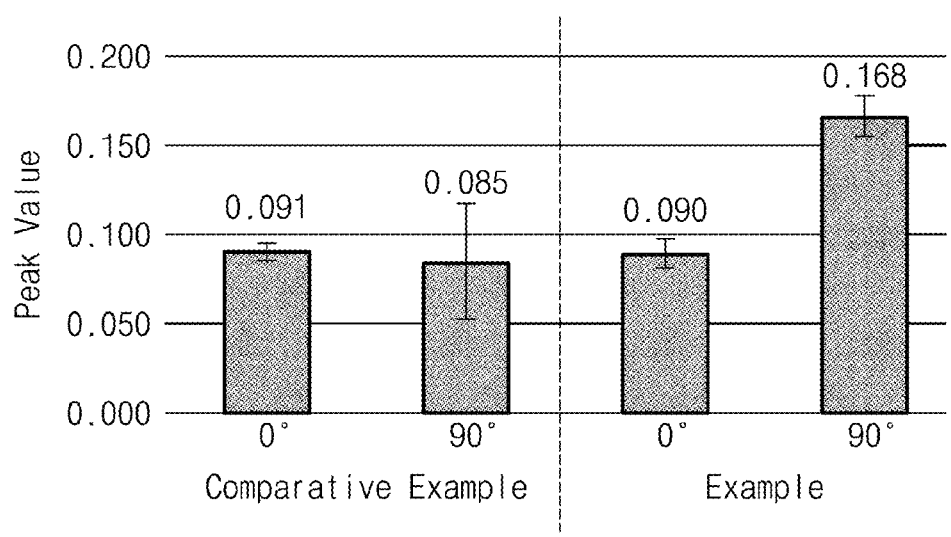
FIG. 11A shows FT-IR analysis results of Comparative Example and Example according to an embodiment of the present disclosure.
Figure 11B:
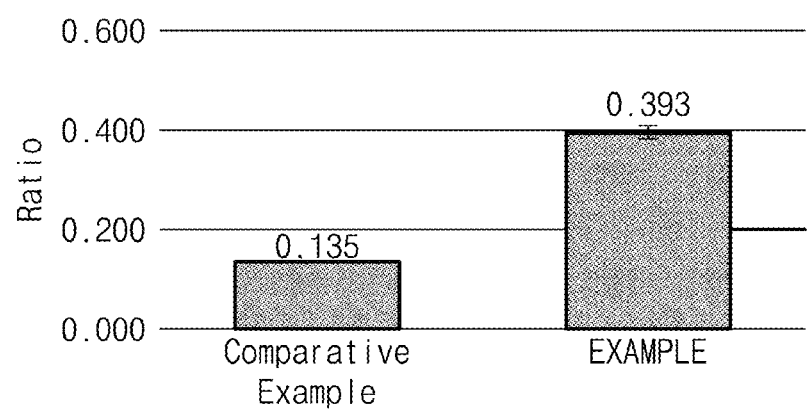
FIG. 11B shows FT-IR analysis results of Comparative Example and Example according to an embodiment of the present disclosure.
Figure 11C:
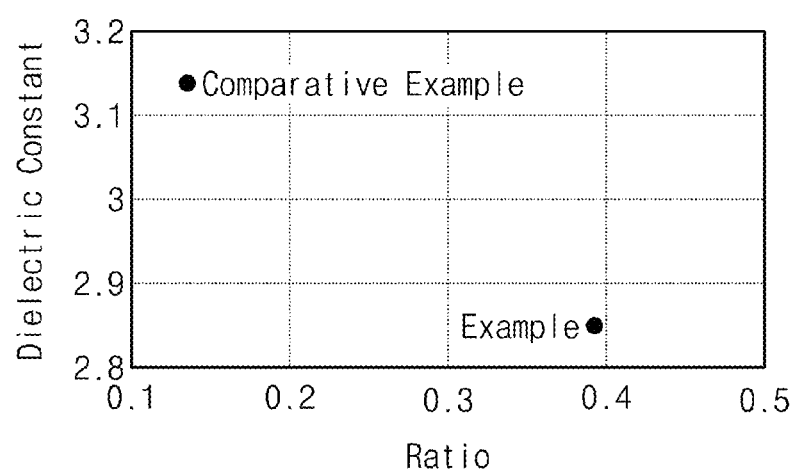
FIG. 11C shows a dielectric constant of each of Comparative Example and Example according to an embodiment of the present disclosure.

FIG. 11A and FIG. 11B show FT-IR analysis results of Comparative Example and Example, respectively. FIG. 11C shows a dielectric constant of each of Comparative Example and Example. Comparative Example and Example in FIG. 11A to FIG. 11C correspond to the organic layers of Comparative Example and Example in FIG. 9A to FIG. 10B, respectively.

FIG. 11A shows a value of a polarized infrared spectrum measured in the polarized measurement mode using the FT-IR as described with reference to FIG. 8. In FIG. 11A, 0° indicates an absorbance measured when the light PLx polarized in the 0° direction (FIG. 8) is provided, while 90° indicates an absorbance measured when the light PLy polarized in the 90° direction (FIG. 8) is provided. Example in FIG. 11A corresponds to the organic layer produced using the composition according to an embodiment of the present disclosure, while Comparative Example FIG. 11A corresponds to a conventional organic layer including a polymer material produced using a monomer with less aliphatic hydrocarbons than that of Example.

A peak value in FIG. 11A represents a peak value at 1725 $cm^{-1}$ among the FT-IR peaks, and corresponds to a stretching vibration peak of a C=O bond. Referring to FIG. 11A, in Comparative Example, FT-IR peak values in the 0° and 90° directions were similar to each other. In Example, the FT-IR peak value in the 90° direction was significantly larger than the FT-IR peak value in the 0° direction. For example, the FT-IR peak in the 90° direction is 0.168 for the Example whereas the FT-IR peak in the 0° direction is 0.090 for the Example. Referring to FIG. 11A, the molecular anisotropy in Comparative Example is equal to about 1, while the molecular anisotropy in Example is equal to about 1.87.

FIG. 11B shows a ratio between an absorbance of an infrared spectrum in an infrared spectroscopy by a C—H bond and an absorbance of an infrared spectrum in an infrared spectroscopy by a C=O bond in each of Comparative Example and Example. For example, the ratio in FIG. 11B may be defined as "(absorbance of infrared spectrum in infrared spectroscopy by C—H bond)/(absorbance of infrared spectrum in infrared spectroscopy by C=O bond)". In one example, the ratio in FIG. 11B may be defined as shown in Equation 2 below.

$$\text{Ratio} = (\text{absorbance at } 2850\ cm^{-1})/(\text{absorbance at } 1725\ cm^{-1}) \quad [\text{Equation 2}]$$

In Equation 2, "absorbance at 2850 $cm^{-1}$" is due to vibration of the C—H bond, while "absorbance at 1725 $cm^{-1}$" is due to vibration of the C=O bond.

Referring to FIG. 11B, in Comparative Example, the ratio between the absorbance of the infrared spectrum in an infrared spectroscopy by the C—H bond and the absorbance of the infrared spectrum in an infrared spectroscopy by the C=O bond was about 0.135, while in Example, the ratio between the absorbance of the infrared spectrum in an infrared spectroscopy by the C—H bond and the absorbance of the infrared spectrum in an infrared spectroscopy by the C=O bond was about 0.40 (e.g., 0.393).

Referring to FIG. 11B, it may be seen that the polymer included in the organic layer produced using the composition according to an embodiment of the present disclosure has a ratio of a content of the C—H bond to a content of the C=O bond which is larger than a ratio of a content of the C—H bond to a content of the C=O bond in Comparative Example. For example, it may be seen that Example exhibits a low polarity because a content of the C=O bond is less than that in Comparative Example.

In an embodiment, at least one organic layer may have the ratio between the absorbance of the infrared spectrum in an infrared spectroscopy by the C—H bond and the absorbance of the infrared spectrum in an infrared spectroscopy by the C=O bond which may be a value in a range of about 0.25 to about 0.40 inclusive. In the organic layer according to an embodiment of the present disclosure, a content of the aliphatic hydrocarbon in the polymer included in the organic layer increases, so that the ratio between the absorbance of the infrared spectrum in an infrared spectroscopy by the C—H bond and the absorbance of the infrared spectrum in an infrared spectroscopy by the C=O bond is greater than or equal to about 0.25. Further, the number of aliphatic hydrocarbons is limited to maintain strength characteristics of the organic layer. Accordingly, the ratio between the absorbance of the infrared spectrum in an infrared spectroscopy by the C—H bond and the absorbance of the infrared spectrum in an infrared spectroscopy by the C=O bond is less than or equal to about 0.40. For example, in the organic layer according to an embodiment of the present disclosure, the ratio between the absorbance of the infrared spectrum in an infrared spectroscopy by the C—H bond and the absorbance of the infrared spectrum in an infrared spectroscopy by the C=O bond may be in a range of about 0.25 to about 0.40, such that the organic layer exhibits the low dielectric constant characteristics.

FIG. 11C shows a comparison of dielectric constant values of organic layers in Comparative Example and Example. FIG. 11C shows a dielectric constant value based on a ratio between an absorbance of an infrared spectrum in an infrared spectroscopy by a C—H bond and an absorbance of an infrared spectrum in an infrared spectroscopy by a C=O bond in each of Comparative Example and Example. Referring to FIG. 11C, it may be seen that Example in which the ratio between an absorbance of an infrared spectrum in an infrared spectroscopy by a C—H bond and an absorbance of an infrared spectrum in an infrared spectroscopy by a C=O bond is larger than that of Comparative Example and exhibits a lower dielectric constant characteristic compared to that of Comparative Example.

For example, referring to FIG. 11A to FIG. 11C, it may be seen that the organic layer according to an embodiment of the present disclosure includes a polymer having a high ratio of a content of the C—H bond to a content of C=O bond, compared to that of Comparative Example, and thus has a lower polarity, and also has a low dielectric constant value.

Therefore, at least one organic layer OL included in the encapsulation layer TFE according to an embodiment of the present disclosure may be produced using the composition according to an embodiment of the present disclosure including a monomer compound having a relatively larger number of the aliphatic hydrocarbons than a conventional organic layer. Further, the organic layer OL including the polymer produced using the composition according to an embodiment of the present disclosure may exhibit low dielectric constant characteristics due to the greater molecular anisotropy of the polymer. Further, the low dielectric constant characteristics of the organic layer OL may reduce noise of the sensor layer TP disposed on the encapsulation layer TFE (FIG. 3), and increase the touch sensitivity of the sensor layer TP. For example, the encapsulation layer TFE according to an embodiment of the present disclosure may include the organic layer OL having the low dielectric constant characteristic to reduce a capacitance between the second electrode CE disposed under the encapsulation layer TFE and the first and second conductive layers ML1 and ML2 disposed above the encapsulation layer TFE, thereby increasing the touch sensitivity of the sensor layer TP.

Again, referring to FIG. 5, the encapsulation layer TFE-1 according to an embodiment of the present disclosure may include the n inorganic layers IL1 to ILn including the first inorganic layer IL1 disposed on the light emitting element EMD (FIG. 3). Further, the first inorganic layer IL1 may be disposed on and in direct contact with the light emitting element EMD (FIG. 3). The first inorganic layer IL1 may be defined as a lower inorganic layer, while inorganic layers other than the first inorganic layer IL1 among the n inorganic layers IL1 to ILn may be defined as upper inorganic layers.

The encapsulation layer TFE-1 may include the n−1 organic layers OL1 to OL n−1. The n−1 organic layers OL1 to OL n−1 and the n inorganic layers IL1 to ILn may be alternately arranged with each other (e.g., in the third direction DR3). An average thickness of the n−1 organic layers OL1 to OL n−1 may be larger than that of the n inorganic layers IL1 to ILn.

In an embodiment, each of the n inorganic layers IL1 to ILn may be a single layer including one type of a material, or a multilayer including two or more types of materials. Each of the n inorganic layers IL1 to ILn may include at least one compound selected from silicon nitride, silicon oxynitride, or silicon oxide. For example, in an embodiment, at least one of the n inorganic layers IL1 to ILn may include titanium oxide or aluminum oxide. However, embodiments of the present disclosure is not limited thereto.

At least one of the n−1 organic layers OL1 to OL n−1 may have the characteristics of the organic layer OL (FIG. 4) according to an embodiment of the present disclosure. At least one of the organic layers OL1 to OL n−1 may be produced using the composition according to an embodiment of the present disclosure. For example, at least one of the organic layers OL1 to OL n−1 may include the polymer having the relatively large molecular anisotropy to exhibit the low dielectric constant.

An embodiment of the electronic device ED (FIG. 2) may include the encapsulation layer TFE-1 according to an embodiment of the present disclosure. An embodiment of the electronic device ED (FIG. 2) may include at least one organic layer of the n−1 organic layers OL1 to OL n−1 having the low dielectric constant characteristics and thus having the increased sensitivity of the sensor layer TP.

A following Table 2 show a comparison between the dielectric constant characteristics of the organic layers of Comparative Example and Example, and comparisons between touch sensitivities and between capacitances Cb of the electronic devices of Comparative Example and Example.

TABLE 2

| Examples | Dielectric constant | Touch sensitivity (%) | Cb (%) |
| --- | --- | --- | --- |
| Comparative Example | 3.14 | 100 | 100 |
| Example | 2.75 | 110 | 92 |

A test sample was manufactured such that the organic layer thickness was 8.8 μm and the sample had a stack structure of molybdenum (Mo)/organic layer/silver (Ag). Then, the dielectric constant thereof was measured. The result is shown in the above Table 2. Comparative Example and Example have different organic layer materials. In Table 2, the dielectric constant of Comparative Example is the value corresponds to that of the organic layer of Comparative Example as described above with reference to FIGS. 9A to 11C. Further, the dielectric constant of Example in Table 2 corresponds to that of the organic layer of Example as produced using the composition according to an embodiment as above-described.

In Table 2, the dielectric constant value of each of Comparative Example and Example represents an average value of 12 samples. Referring to the results in Table 2, it may be seen that Example exhibits a lower dielectric constant value than that of Comparative Example, and the dielectric constant value of Example is reduced by 10% or greater, compared to that of Comparative Example.

Further, the touch sensitivity and the capacitance shown in Table 2 were measured in a structure of the electronic device. Comparative Example and Example differ from each other only in terms of the organic layer of the encapsulation layer with the Example including the polymer formed from the composition according to an embodiment of the present disclosure. Table 2 shows the touch sensitivity and the capacitance of Example relative to the touch sensitivity and the capacitance of Comparative Example, respectively. For example, the touch sensitivity and the capacitance in Example are based on the touch sensitivity 100% and the capacitance 100% in Comparative Example, respectively. The touch sensitivity was evaluated by measuring a signal intensity when using a touch pen. The capacitance was measured as a capacitance between the second electrode of the light emitting element and the sensor layer.

Referring to the results of Table 2, Example had a decrease in the capacitance value of about 8%, compared to that of Comparative Example. In other words, Example included a (meth)acrylate-based polymer with the relatively large molecular anisotropy as an organic layer material and had a lower dielectric constant value, and thus had a reduced capacitance value, compared to that of Comparative Example.

Further, Example exhibited an increase in the touch sensitivity of about 10% or greater, compared to that of Comparative Example. For example, Example included the organic layer including the polymer material having the greater molecular anisotropy and thus had low dielectric constant characteristics and thus had increased touch sensitivity characteristics, compared to that of Comparative Example.

The electronic device according to an embodiment of the present disclosure may include the encapsulation layer disposed below the sensor layer and including the organic layer made of the polymer material having a low dielectric constant, and thus may have increased touch sensitivity of the sensor layer. For example, in the electronic device according to an embodiment of the present disclosure, the organic layer of the encapsulation layer includes the polymer material having the greater molecular anisotropy and thus had low dielectric constant characteristics, and thus the sensing characteristics of the sensor layer disposed on the encapsulation layer may be increased. Further, the electronic device according to an embodiment includes the (meth)acrylate polymer having the low dielectric constant as the material of the organic layer of the encapsulation layer. Thus, the capacitance between the second electrode (the upper electrode) of the light emitting element and the conductive layer of the sensor layer, thereby reducing the sensing malfunction of the sensor layer and increasing the sensitivity of the sensor layer.

Embodiments of the present disclosure may provide the electronic device including the encapsulation layer including the organic layer including the polymer material having the anisotropic molecular structure such that the organic layer has the reduced dielectric constant.

Embodiments may provide the electronic device including the encapsulation layer including the organic layer of a low dielectric constant such that an operational quality of the sensor layer provided on the encapsulation layer may be increased.

While the present disclosure has been described with reference to embodiments thereof, it will be apparent to those of ordinary skill in the art that various changes and modifications may be made thereto without departing from the spirit and scope of the present disclosure and the description of embodiments provided herein are for purposes of illustration and not limitation.

What is claimed is:

1. An electronic device comprising:
a light emitting element;
an encapsulation layer disposed on the light emitting element, wherein the encapsulation layer includes a polymer having a molecular anisotropy greater than or equal to about 1.4; and
a sensor layer disposed on the encapsulation layer,
wherein the molecular anisotropy is a ratio of a first absorbance of an infrared spectrum in an infrared spectroscopy when first polarized light that is polarized in a first direction perpendicular to a second direction is incident to the polymer to a second absorbance of an infrared spectrum in an infrared spectroscopy when second polarized light that is polarized in the second direction is incident to the polymer.

2. The device of claim 1, wherein the molecular anisotropy of the polymer is in a range of about 1.4 to about 1.9.

3. The device of claim 1, wherein the polymer is produced using a composition containing a dimethacrylate compound, a (meth)acrylate compound, and a photo-initiator.

4. The device of claim 3, wherein the composition includes the dimethacrylate compound in a range of about 50 wt % to about 90 wt %, the (meth)acrylate compound in a range of about 0 wt % to about 40 wt %, and the photo-initiator in a range of about 1 wt % to about 10 wt %, based on a total weight of the composition of 100 wt %.

5. The device of claim 3, wherein the composition further contains an acrylate-based cross-linker.

6. The device of claim 1, wherein the polymer includes a (meth)acrylate-based polymer.

7. The device of claim 1, wherein a glass transition temperature of the polymer is in a range of about −28° C. to about 1.4° C.

8. The device of claim 1, wherein the encapsulation layer includes at least one organic layer and at least one inorganic layer,
wherein the at least one organic layer includes the polymer.

9. The device of claim 8, wherein the at least one organic layer and the at least one inorganic layer are alternately stacked with each other.

10. The device of claim 8, wherein a dielectric constant of the at least one organic layer is in a range of about 2.6 to about 3.0.

11. The device of claim 8, wherein a content of oxygen atoms in the at least one organic layer is less than or equal to about 5 at %.

12. The device of claim 8, wherein the at least one organic layer has a ratio of an absorbance of an infrared spectrum in an infrared spectroscopy by a C—H bond to an absorbance of an infrared spectrum in an infrared spectroscopy by a C=O bond in a range of about 0.25 to about 0.40.

13. The device of claim 1, wherein the sensor layer is disposed directly on the encapsulation layer.

14. An electronic device comprising:
a light emitting element;
an encapsulation layer disposed on the light emitting element, wherein the encapsulation layer includes at least one organic layer having a dielectric constant in a range of about 2.6 to about 3.0; and
a sensor layer disposed on the encapsulation layer,
wherein the at least one organic layer includes a (meth)acrylate-based polymer produced using a composition containing a dimethacrylate compound, a (meth)acrylate compound, and a photo-initiator, wherein
the dimethacrylate compound comprises a methacrylate moiety at each of both sides thereof, and an alkylene group having 10 or more carbon atoms between the methacrylate moieties; and
the (meth)acrylate compound comprises a (meth)acrylate moiety and a plurality of alkyl groups as substituents, each alkyl group having 10 or more carbon atoms.

15. The device of claim 14, wherein a molecular anisotropy of the polymer is in a range of about 1.4 to about 1.9, and
wherein the molecular anisotropy is a ratio of a first absorbance of an infrared spectrum in an infrared spectroscopy when first polarized light that is polarized in a first direction perpendicular to a second direction is incident to the polymer to a second absorbance of an infrared spectrum in an infrared spectroscopy when second polarized light that is polarized in the second direction is incident to the polymer.

16. The device of claim 14, wherein the organic layer has a ratio of an absorbance of an infrared spectrum in an infrared spectroscopy by a C—H bond to an absorbance of an infrared spectrum in an infrared spectroscopy by a C═O bond in a range of about 0.25 to about 0.40.

17. The device of claim 14, wherein:
the encapsulation layer is disposed directly on the light emitting element; and
the sensor layer is disposed directly on the encapsulation layer.

18. The device of claim 14, wherein the sensor layer includes:
a first conductive layer disposed on the encapsulation layer;
a second conductive layer disposed on the first conductive layer;
an insulating layer disposed between the first conductive layer and the second conductive layer; and
a sensor base layer disposed below the first conductive layer;
wherein the sensor base layer is disposed directly on the encapsulation layer.

19. The device of claim 14, wherein the composition includes the dimethacrylate compound in a range of about 50 wt % to about 90 wt %, the (meth)acrylate compound in a range of about 0 wt % to about 40 wt %, and the photo-initiator in a range of about 1 wt % to about 10 wt %, based on a total weight of the composition of 100 wt %.

20. The device of claim 14, wherein a content of oxygen atoms in the organic layer is less than or equal to about 5 at %.

21. An electronic device comprising:
a light emitting element;
an encapsulation layer disposed on the light emitting element, the encapsulation layer including n inorganic layers and n−1 organic layers alternately stacked with each other, wherein n is an integer greater than or equal to 2; and
a sensor layer disposed on the encapsulation layer,
wherein at least one of the n−1 organic layers includes a (meth)acrylate-based polymer produced using a composition containing a dimethacrylate compound, a (meth)acrylate compound, and a photo-initiator, wherein
the dimethacrylate compound comprises a methacrylate moiety at each of both sides thereof, and an alkylene group having 10 or more carbon atoms between the methacrylate moieties; and the (meth)acrylate compound comprises a (meth)acrylate moiety and a plurality of alkyl groups as substituents, each alkyl group having 10 or more carbon atoms.

22. The electronic device of claim 21, wherein:
the composition including the dimethacrylate compound in a range of about 50 wt % to about 90 wt %, the (meth)acrylate compound in a range of about 0 wt % to about 40 wt %, and the photo-initiator in a range of about 1 wt % to about 10 wt %, based on a total weight of the composition of 100 wt %.

* * * * *